(12) United States Patent
Necoechea et al.

(10) Patent No.: US 7,849,374 B1
(45) Date of Patent: Dec. 7, 2010

(54) TESTING A TRANSCEIVER

(75) Inventors: R. Warren Necoechea, Scotts Valley, CA (US); Timothy Burnett, Frisco, TX (US); Fengming Zhang, San Jose, CA (US); Harry Hou, San Jose, CA (US)

(73) Assignee: LTX Corporation, Westwood, MA (US)

( * ) Notice: Subject to any disclaimer, the term of this patent is extended or adjusted under 35 U.S.C. 154(b) by 733 days.

(21) Appl. No.: 11/546,806

(22) Filed: Oct. 11, 2006

(51) Int. Cl.
*G01R 31/28* (2006.01)
(52) U.S. Cl. .......................... 714/724; 714/32
(58) Field of Classification Search ............... 708/819; 375/224, 226, 346; 702/182; 331/16; 714/704, 714/712, 724, 32
See application file for complete search history.

(56) References Cited

U.S. PATENT DOCUMENTS

| | | | |
|---|---|---|---|
| 6,694,462 B1 | 2/2004 | Reiss et al. | |
| 6,961,745 B2 * | 11/2005 | Laquai | 708/819 |
| 6,985,823 B2 | 1/2006 | Fishman et al. | |
| 6,990,423 B2 | 1/2006 | Brown et al. | |
| 7,251,302 B2 * | 7/2007 | Murugan et al. | 375/346 |
| 7,295,604 B2 * | 11/2007 | Cranford et al. | 375/226 |
| 2004/0019458 A1 * | 1/2004 | Jang | 702/182 |
| 2005/0111536 A1 * | 5/2005 | Cranford et al. | 375/226 |
| 2005/0238093 A1 * | 10/2005 | Payne et al. | 375/224 |
| 2007/0080752 A1 * | 4/2007 | Smith | 331/16 |

OTHER PUBLICATIONS

Definition, "SerDes," http://searchstorage.techtarget.com/sDefinition/0,.sid5_gci1006456,00.html, 3 pgs. (Jan. 25, 2006).
Skyworks, "APN1002: Design with Pin Diodes," Application Note pp. 1-19 (Jul. 21, 2005).
Micrometrics, "MHV500 Series Microwave Hyperabrupt Tuning Varactors," pp. 1-2 (prior to Jan. 26, 2006).
Coilcraft, "Spice Model-0302CS," Document 158, pp. 1-2 (Mar, 16, 2009 and Sep. 6, 2006).
Coilcraft, "Chip Inducters-0302CS Series (0805)," Document 302-1 and Document 302-2 (Feb. 25, 2004 and Dec. 15, 2004).
Hewlett Packard, "Applications for the HSMP-3890 Surface Mount Switching PIN Diode," pp. 2-54 to 2-58 (prior to January 26, 2006).
IPC-D-317A, "Design Guidelines for Electronic Packaging Utilizing High-Speed Techniques," Table of Contents (*Jan.* 1995).
IPC 2251, "Design Guide for Packaging of High Speed Electronic Circuits," Table of Contents and Section 5, pp.18-52 (Nov. 2003).
Linear Technology, "LTSpice," (Feb. 6, 2003).
Eauleware, "Genesys," pp. 1-3 (2004).

* cited by examiner

*Primary Examiner*—David Ton
(74) *Attorney, Agent, or Firm*—Blakely, Sokoloff, Taylor & Zafman LLP

(57) ABSTRACT

A filter includes at least a pin diode, an inductive element, and a varactor diode coupled as a resonant circuit. The filter injects data dependent jitter into a digital data signal with a given data rate for testing a transceiver.

19 Claims, 29 Drawing Sheets

(A)

(B)

(C)

(A) 3-Stage Filter With Minimum ISI
(B) Single Stage Filter With Minimum ISI
(C) 3-Stage Filter With Maximum ISI (A)

(B)

(C)

(A) 3-Stage Filter With Minimum ISI
(B) Single Stage Filter With Minimum ISI
(C) Single Stage Filter With Maximum ISI (A)

(B)

(C)

TESTING A TRANSCEIVER

TECHNICAL FIELD

Embodiments of the present invention pertain to the field of automatic electrical test systems. More particularly, embodiments of the present invention relate to improvements in the ability of test systems to test bit processing capacities of transceivers.

BACKGROUND

A bit error rate, also known as a bit error ratio (BER), is a ratio of bits received, processed, and/or transmitted with errors to a total number of bits received, processed, and/or transmitted over a given period of time. A BER is typically expressed as ten to a negative power. If, for example, a transmission has 1 million bits and one of these bits is in error (e.g., a bit is in a first logic state instead of a second logic state), the transmission has a BER of $10^{-6}$. The BER is useful because it provides one measurement of the ability of a device to receive, process, and/or transmit bits.

Many devices are designed to receive, process, and then transmit a plurality of bits. An optoelectronic transceiver, for example, receives a plurality of bits in an electrical form and then transforms and transmits the bits in an optical form and/or receives a plurality of bits in an optical form and then transforms and transmits the bits in an electrical form.

To derive a BER for a device under test (DUT), bits transmitted to the DUT are compared to corresponding bits transmitted by the DUT or to corresponding bits in a pattern used to generate the bits transmitted to the DUT. In some applications, the BER of a DUT must be below a defined threshold for the DUT to pass a test.

A Bit Error Rate Test or Tester ("BERT") is a procedure or device that establishes a BER for a DUT or to otherwise quantify a DUT's ability to receive, process, and/or transmit bits. More specifically, a BERT measures the BER of a transmission (e.g., bits transmitted, received, or processed) over a given period of time by a DUT. An example of a BERT includes, among other components, a serializer/deserializer ("SerDes") and a clock source fixed to a host board, such as a printed circuit board (PCB), etc. SerDes devices convert parallel bit streams into serial bit streams that change at a multiple of the input, parallel data rate. They may also perform the reverse function of deserializing serial bit streams, by converting them into parallel bit streams that change at a fraction of the serial data rates. Typically, the SerDes produces serial encoded data (e.g., the bits) used to establish a BER for a DUT. More specifically, serial encoded data is transmitted from a SerDes to a DUT, which attempts to transmit the serial encoded data back to the SerDes. The SerDes compares the output of the DUT to the input to the DUT (or what the input should have been), to establish a BER.

High-speed input/output (I/O) interfaces embedded in communication devices approach Terabit bandwidth. The architecture allowing this bandwidth boost is based on a parallel arrangement of SerDes cells running at data rates of several Gigabit per second and performing an independent serial data transmission on each lane in parallel (SerDes multilane interface). Gigahertz SerDes devices have gained more and more applications. They are being implemented in devices from high end microprocessors, to high volume low end wireless base bands.

However, economic production testing of such interfaces and SerDes devices imposes a significant challenge. Instrument based solutions are typically costly and slow and the test approach of using a simple loop back between transmit and receive portion of the SerDes typically does not cover faults resulting from data signals exposed to intersymbol interference (ISI) while being transmitted via transmission lines or cables.

A SerDes lane is generally comprised of a Transmit-Receive (Tx-Rx) pair. Nearly all lanes have Built In Self Test (BIST) designs for looping back Tx to Rx with pseudo-random binary sequence (PRBS) and other repetitive patterns for production testing. However, internal or external loop back alone is typically not enough to screen poor performing devices. External signal conditioning, such as ISI injection, is typically required to verify Rx input eye and equalization.

The ability to inject ISI into the data stream is key to characterization and test of SerDes devices. ISI happens due to the low pass nature of transmission line. When alternate 1's and 0's are present in data, the received signal has a shorter time to reach the maximum level, as compared with the consecutive 1β or 0's, in which the received signal pattern can reach higher voltage levels. These changes of signal amplitudes may cause the Phase Lock Loop (PLL) to vary in frequency. Further, harmonics travel with different speeds over transmission line due to their frequencies and so reach the receiver at different moments. This is why pre-emphasis at driver and equalization at receiver is helpful to reduce ISI.

Timing jitter injection has been used by some Automatic Test Equipment (ATE) manufacturers to evaluate the ability of a device to compensate for the interconnect bandwidth, but the effects are typically totally different from using ISI injection. Proper shaping of the frequency response of input buffers can compensate for rolloff in interconnect but not for random jitter. Even if variable timing is induced to emulate the effects of interconnect rolloff, the effect is different from inducing both the phase and amplitude characteristics of the ISI filter.

One method for ISI injection is to use a set of traces in transmission line (such as FR4) and provide a means to select the desired length with a multiplexer. The market requirement is increments of 6 inches. The approach using FR4 transmission line requires considerable space, and it is typically prone to crosstalk and typically requires a large fan-out and multiplexer to realize. The varactor only approach reasonably covers only about 20 to 40 inches of FR4, and thus typically has a limited range of emulation.

SUMMARY

A filter includes a pin diode, an inductive element, and a varactor diode coupled as a resonance circuit. The filter injects data dependent jitter onto a digital data signal with a given data rate for testing a transceiver.

Other features and advantages of embodiments of the invention will be apparent from the accompanying figures and from the detailed description which follows below.

BRIEF DESCRIPTION OF THE DRAWINGS

One or more embodiments of the present invention are illustrated by way of example and not limitation in the figures of the accompanying drawings, in which like references indicate similar elements, and in which.

DETAILED DESCRIPTION

An ISI filter that is highly adjustable and can be used for SerDes testing is described. The ISI filter can be adjusted for a range of transmission line or cable length and a range of transmission line frequency characteristics. According to some embodiments, the ISI filter is a multiple stage variable low pass filter that utilizes pin diodes in the filter structure to obtain large variations in attenuation characteristics and varactor diodes in the filter structure to obtain large variations in capacitance of the filter. The ISI filter can be used for SerDes testing to emulate ISI introduced by the transmission line, and further can be used to measure the ability of a SerDes device to reject the effects of ISI. A method described herein uses a combination of varactor diodes, pin diodes and inductors to emulate the filter response of a PCB.

According to some embodiments, the ISI filter is a three stage tunable low pass filter in a differential configuration consisting of varactor diodes, PIN diodes, and fixed inductors. Accordingly, the ISI filter can emulate a larger variation of transmission line length (approximately from 6 inch to 50 inch or from 30 inch to 90 inch based on simulation results) by using different inductor values. Eye closure up to 28% horizontal VI at 1 Gbps and 100% at 6.4 Gbps may be obtained.

According to some embodiments, the ISI filter is a single stage filter for higher bit rate ISI injection. The single stage filter provides from about zero ISI up to the minimum achievable by the three-stage ISI filter.

Figure 1:
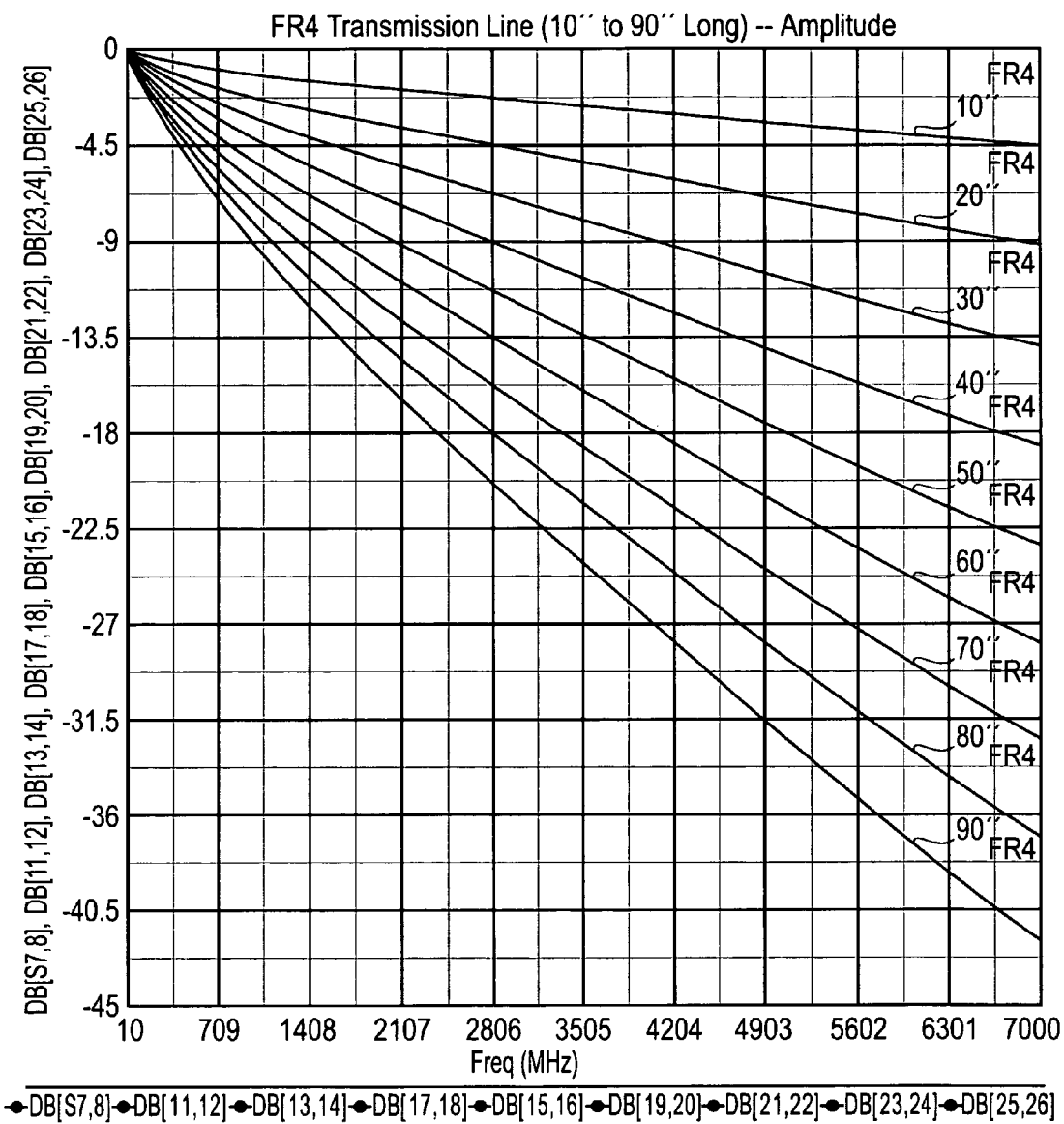
FIG. 1 is an illustration of amplitude characteristics of a transmission line made of FR4 material of different lengths over frequency.

FIG. 1 shows an illustration of amplitude characteristics of a transmission line made of FR4 material of different lengths (from 10 inches to 90 inches) over frequency. As shown in FIG. 1, the loss of transmission line versus frequency for some length of FR4 (transmission line material) follows a similar curve for each length. Also, FIG. 1 illustrates the concept that the longer the transmission line, the greater the attenuation over frequency. Thus, for instance, while a 10 inch FR4 transmission line experiences an attenuation of approximately 4.5 DBs (decibels) over frequency (from 10 to 7000 Megahertz (MHz)), a 90 inch FR4 transmission line experiences an attenuation of approximately 42.5 DBs over the same frequency.

Figure 2:
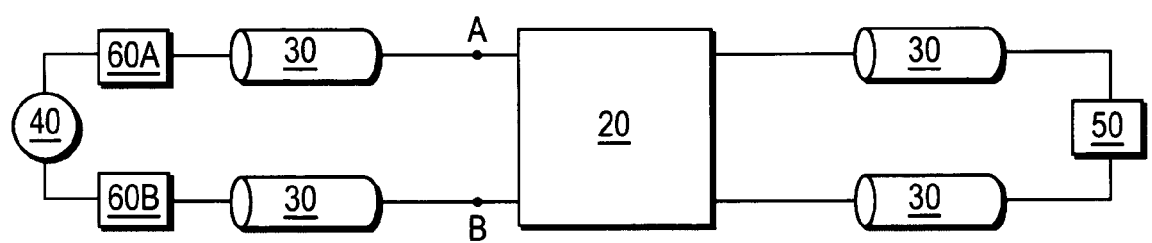
FIG. 2 shows an embodiment of a filter arrangement with a filter structure for injecting ISI.

FIG. 2 shows an embodiment of a filter arrangement with a filter structure 20 according to an embodiment of the present invention for injecting ISI. In the example of FIG. 2, the filter structure 20 is inserted between nodes A and B into a transmission line 30 carrying a data signal from a data source 40 to a data sink 50. The arrangement of data source 40, data sink 50, and transmission line 30 is differential. Source impedances 60A and 60B are also shown.

Figure 3A:
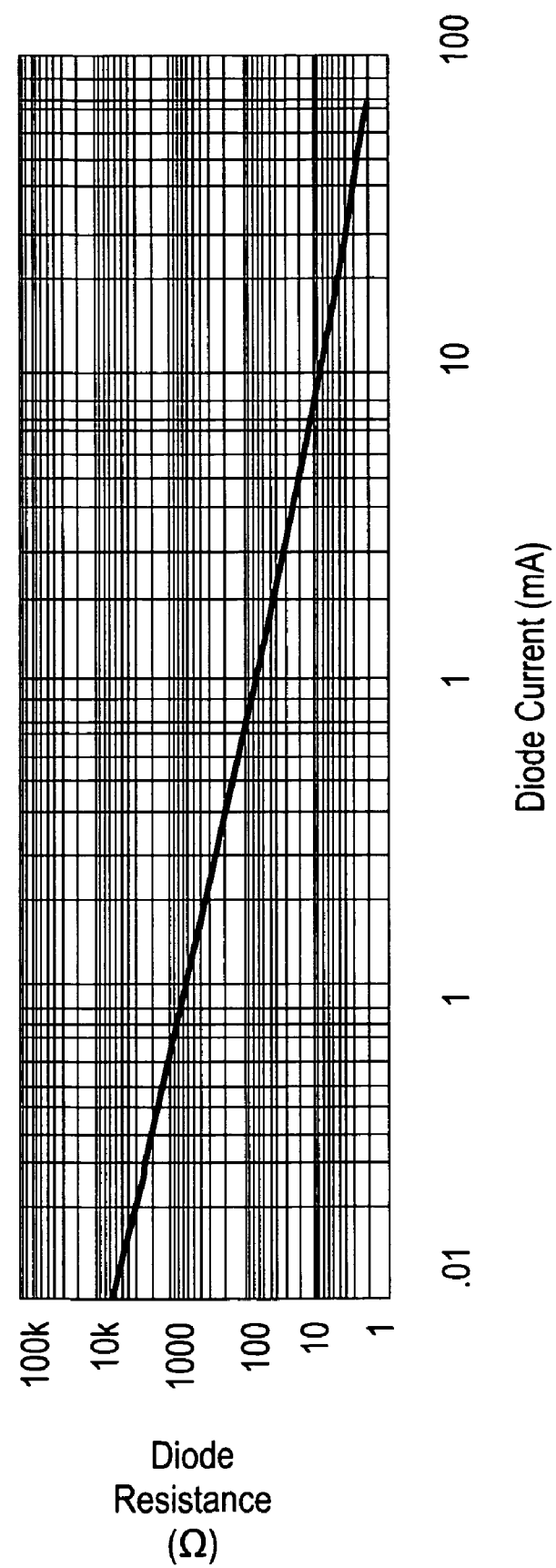
FIG. 3A is an illustration of typical characteristics of a Pin diode.
Figure 3B:
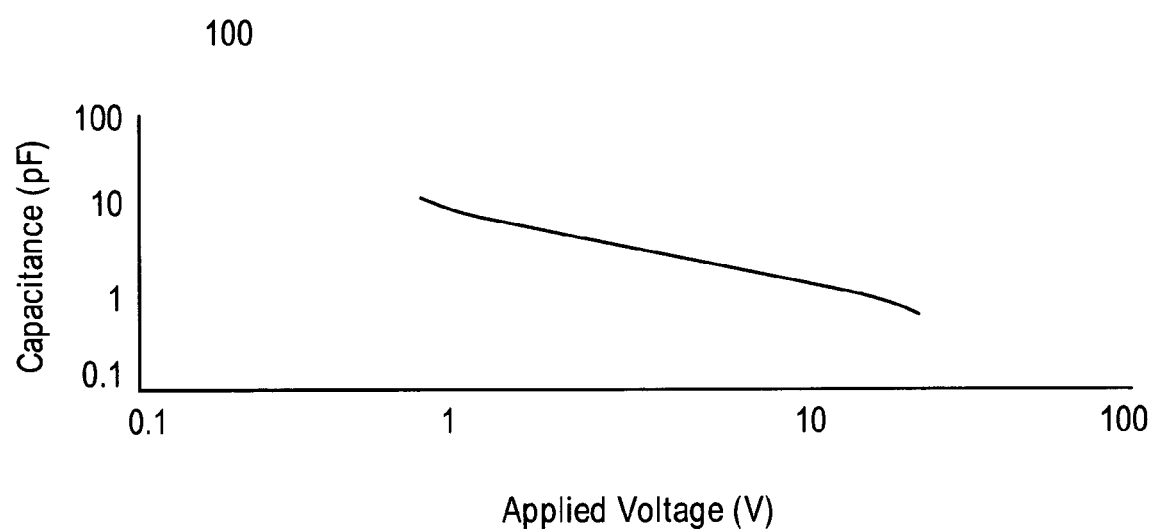
FIG. 3B is an illustration of typical characteristics of a varactor diode.

FIG. 3A is an illustration of typical characteristics of a pin diode. Pin diodes have resistance with forward current and behave like resistors for high frequencies. FIG. 3B is an illustration of typical characteristics of a varactor diode. Varactor diodes have capacitance that varies with reverse applied voltage, as shown.

Figure 4A:
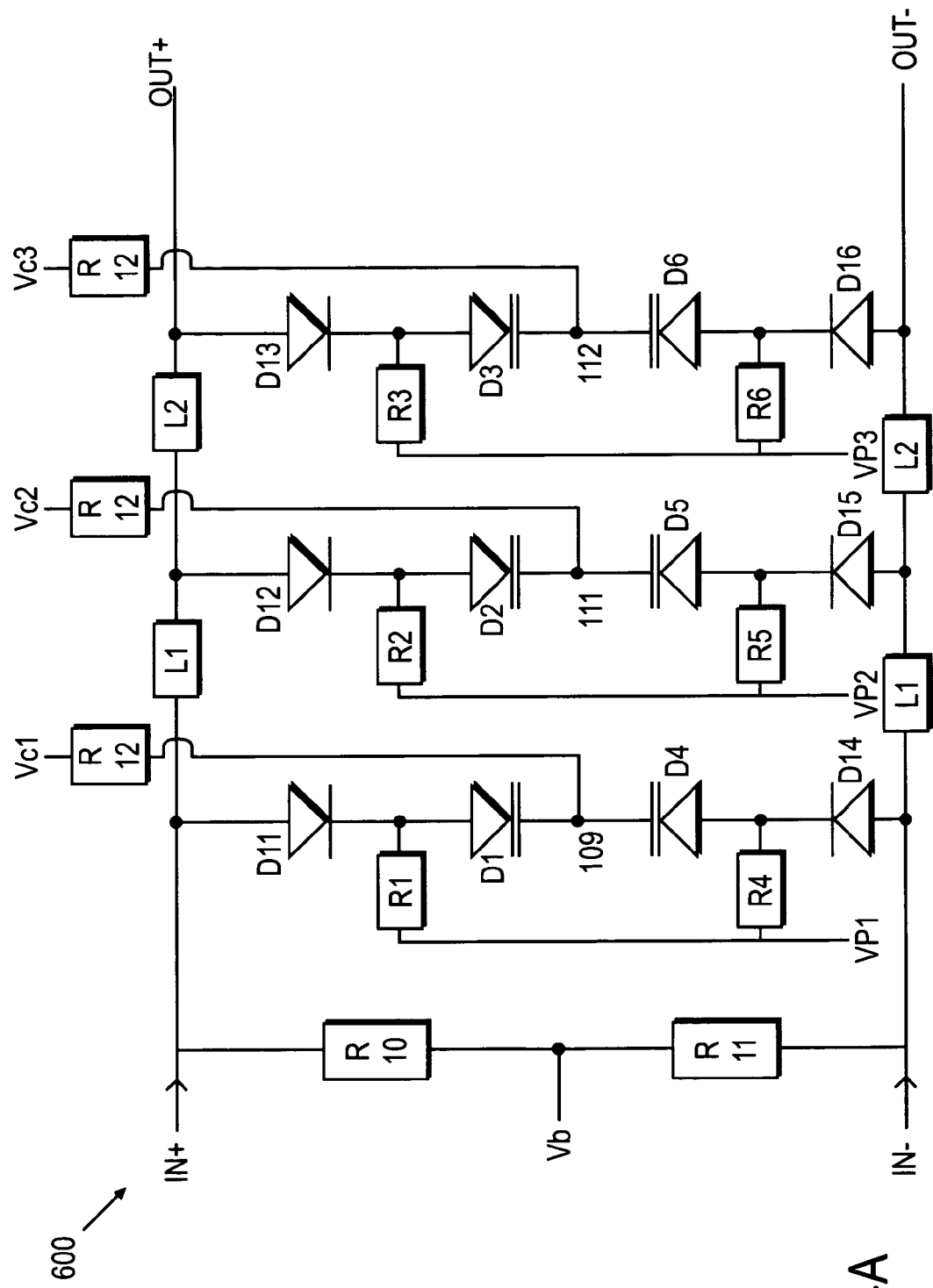
FIG. 4A shows an embodiment of a filter structure consisting of a multi stage resonance circuit.

FIG. 4A shows an embodiment of the filter structure 600 consisting of a multi stage resonance circuit. The filter structure 20 is a tunable low pass filter in a differential configuration using varactor diodes (D1-D6), pin diodes (D11-D16) and fixed inductors (L1-L4). The voltages VP1 to VP3 are PIN diode drivers, while Vc1 to Vc3 are varactor diode drivers, and Vb is the DC bias voltage. The differential filter 600 may operate at a signal level of approximately 400 mV peak to peak differential. The attenuation frequency is determined by the value of the varactor capacitors (D1-D6) while the shape of the attenuation is controlled by the amount of damping provided by the pin diodes (D11-D16).

The bandwidth of the filter 600 may be increased by lowering the capacitance of the varactor diodes D1-D6. This can be achieved by increasing the voltage on nodes 109, 111 and 112. Vc1, Vc2, Vc3 are Varactor control voltages. Changing the common mode voltage at nodes 109, 111 and 112 has the affect of changing the capacitance of varactor diode pairs D1 and D4, D2 and D5, D3 and D6 respectively. Increasing the capacitance of a varactor diode pair has the affect of emulating a transmission line that is longer.

The pin diodes D11-D16 enable the lossiness of the filter 600 to be varied, such that a transmission line can be matched at a broad range of frequencies and transmission line lengths. The sharpness of the attenuation characteristic of the filter 600 is increased by lowering the resistance of the pin diodes (D11-D16). This is achieved by increasing the current through the pin diodes D11-D16.

The current through each pair of pin diodes (D11 and D14, D12 and D15, D13 and D16) for each stage of the RLC circuit shown in filter 600 can be varied by using divider circuits. For instance, current through the pin diodes D11 and D14 can be varied by pulling current through resistors R1 and R4. Similarly, current through the pin diodes D12 and D15 can be varied by pulling current through resistors R2 and R5, and current through the pin diodes D13 and D16 can be varied by pulling current through resistors R3 and R6.

The inductors L1-L2 and capacitors control the frequency at which roll off begins and resistance of the pin diodes control the slope of that attenuation is controlled by the resistance of the pin diodes.

The filter structure can emulate the characteristics of transmission lines, including linear phase delay and a smooth attenuation vs. frequency curve. The use of pin diodes enables varying the amount of lossiness therefore matching transmission line characteristics across a broad range of frequencies and transmission line lengths. According to embodiments of the present invention, a single filter can create up to 50% eye closure at data rates of 1 billion bits per second (1 Gbps) (equivalent to about 50 inches of trace in FR4 transmission line) and less than 50% eye closure at 6.4 Gbps (equivalent to about 6 inches of trace in FR4 transmission line) by varying the reverse voltage on the varactors and the forward current through the pin diodes. The filter structure can also be repeated to emulate transmission lines that are even longer. The variable low pass filter emulates the characteristics of transmission line and thereby measures the ability of a device to compensate its effects. The filter also exhibits a linear phase characteristic, thus emulating a transmission line.

Figure 4B:
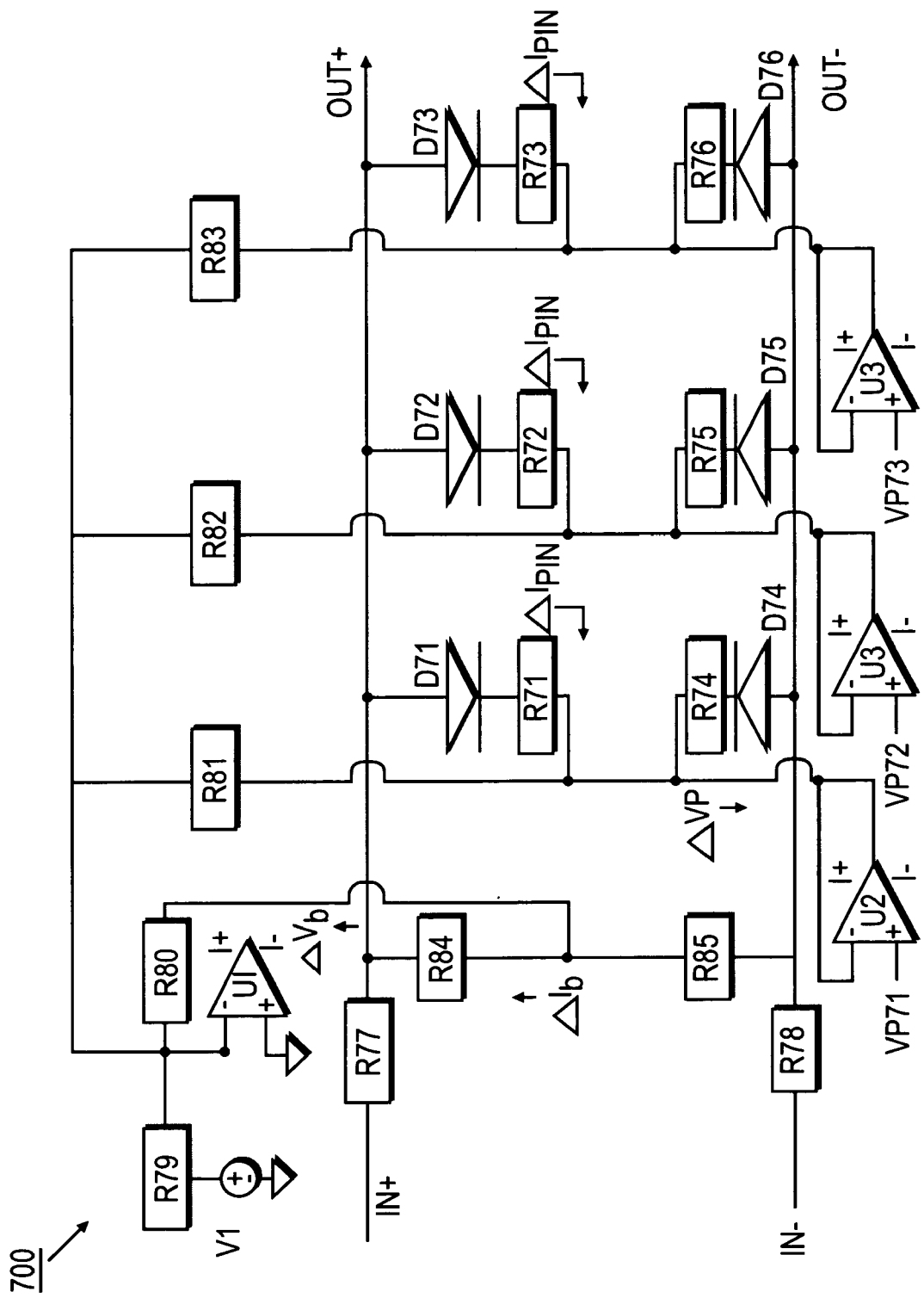
FIG. 4B shows an embodiment of a three stage tunable filter that employs a D.C. balance circuit.

Varying the current through the PIN diodes D12 and D15 would shift the operating voltage across the filter 600 and the bias current of a buffer which drives it. To eliminate this effect, a D.C. balance circuit may be used. An embodiment of a three stage tunable filter that employs a D.C. balance circuit is shown in FIG. 4B.

The embodiment of the three stage tunable filter 600 shown in FIG. 4A requires 6 voltage drivers. The varactor diodes D1-D6 are reverse biased and will not conduct any DC current. As such, according to some embodiments of the present invention, varactor drivers VCI to VC3 (not shown) provide voltage on the cathodes of the varactor diodes. In some embodiments, varactor drivers VCI to VC3 are able to provide up to 25 volts (V) voltage on the cathodes of the varactor diodes. On the filter DC circuit 700 in FIG. 4B, for the sake of simplicity, both varactors and the varactor drivers are not included.

Operational amplifier U1 provides pull down current for the buffer which drives the filter 700. It also sums the current through the PIN diodes and forces an equal and opposite current into the filter through resistors R84 and R85 so that varying the PIN diode current would not shift the operating voltage through the filter 700. In one embodiment, the resistors R84 and R85 are 360 ohm (Ω) each. Note that this current compensation scheme is only approximate and valid when the change in voltage across the pin diodes is small compared to that of R71-R76. The pin diodes are never operated in reverse biased so this approximation works well for the function of keeping the pull down current of the filter buffer constant.

According to some embodiments of the present invention, the DC circuit is designed to have filter DC operating voltage around 1.5V and each pin diode is conducting at least 1 mA current. In some embodiments, the pin diode current is linearly increased to 12 mA as the PIN diode driver voltage VP71=VP72=VP73 is sweeping from 1.5V to −5V, while the filter output voltage V(out) is almost constantly at 1.5V.

Resistance values for resistors R81 to R83 can be calculated using the following equations. For a voltage change ΔVP on a PIN diode driver, say VP71, considering the single-ended case, it causes $$\Delta I_{PIN} = \frac{\Delta VP}{R71} \text{ on PIN diode } D1 \text{ current,} \qquad (1)$$

$$\Delta V_b = \frac{R80}{R81} \Delta VP \text{ on } U1 \text{ output voltage, and} \qquad (2)$$

$$\Delta I_b = \frac{\Delta V_b}{R84} \text{ on current through } R84. \qquad (3)$$

To keep filter operating voltage constant, $\Delta I_b$ has to be equal to $\Delta I_{PIN}$, therefore R81, $$R82 \text{ and } R83 \text{ are } R81 = R82 = R83 = \frac{R71}{R84} \times R80.$$

For R71=470Ω, R80=10 kΩ, and $$R84 = 360 \text{ } \Omega, R81 = R82 = R83 = \frac{470}{360} \times 10k = 13.06 k\Omega.$$

In one embodiment, R71=R72=R73=R74=R75=R76=470Ω, R79=24 kΩ, R77=R78=51Ω, V1=3.3V.

While the filter 600 shown in FIG. 4A and the filter 700 shown in FIG. 4B is a Pi-equivalent of a transmission line, it can also be designed as a T-equivalent.

There may be active buffering before the filter 700. It is assumed that the transmission line length between the buffer and the filter is electrically short, i.e., it is shorter than a quarter-wavelength of the highest frequency transmitted. So the termination before the filter is not considered. Because the filter will reflect signals, the termination is designed to be back-end termination so that the reflection will be absorbed by the driver. A typical driver, such as OnSemi NBSGII, may have about 7Ω output resistance. According to FIG. 4B, the equivalent resistance of the back-end termination is: (7+R77∥R84=(7+51)∥360=50 Ω.

Figure 4C:
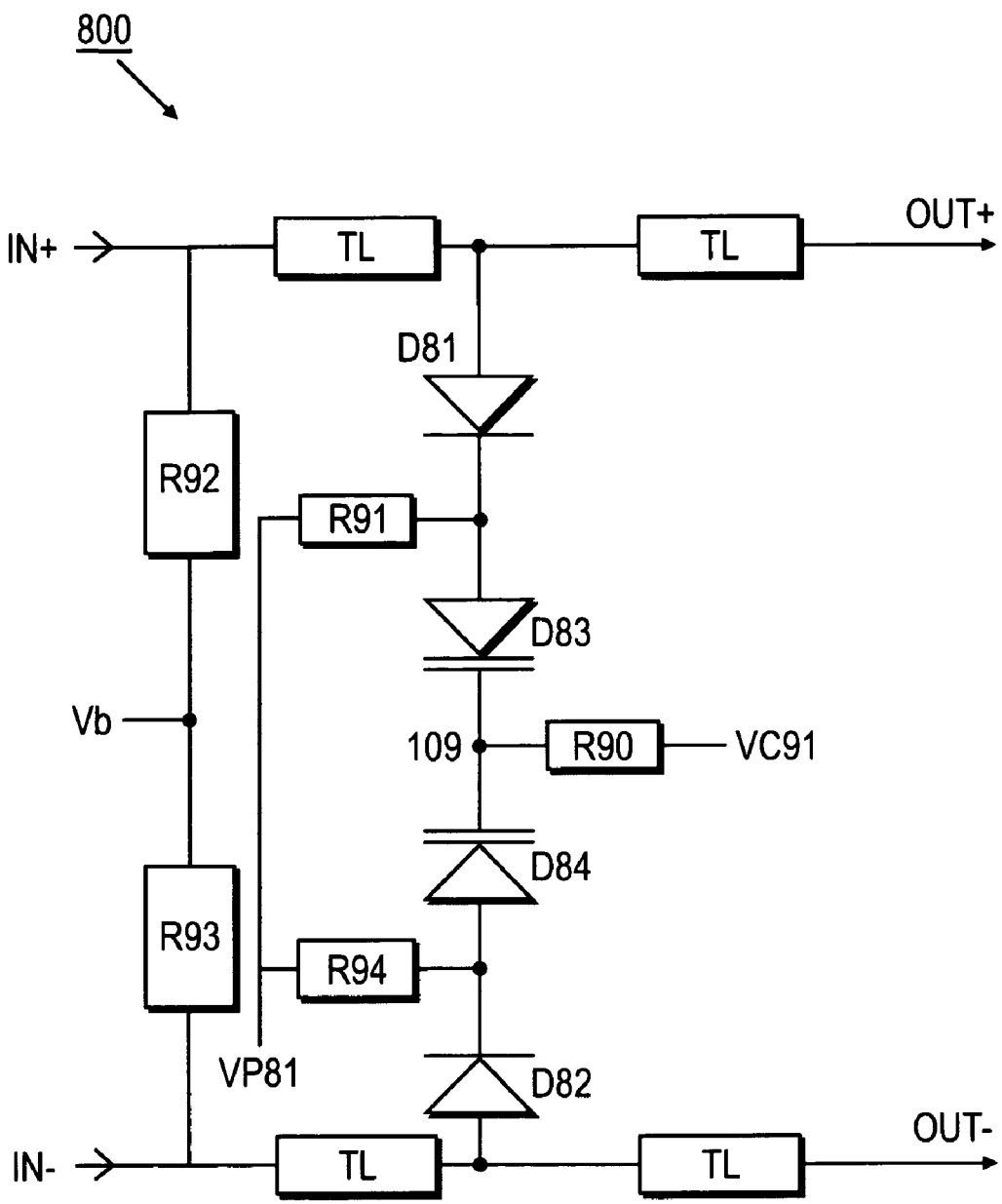
FIG. 4C shows an embodiment of single stage filter.

The three stage filter shown in FIG. 4A can have minimum ISI injection by tuning the PIN diode resistance to the largest and the varactor diode capacitance to the smallest. However, for higher bit rates, component parasitic capacitance and inductance reduce the filter bandwidth to less than theoretical. Therefore, a single stage filter 800 is designed for higher bit rate applications, and an embodiment is illustrated in FIG. 4C.

Instead of using inductor components that have parasitic capacitance from the part and pads, single stage filter 800 uses microstrip transmission lines to provide the required inductance L. Accordingly, if the transmission line trace width is W, the transmission line length x can be calculated by $$x = \frac{L}{L_0} \quad (4)$$

where, $L_0 = C_0 \beta_0^2$, (5)

$$C_0 = \frac{\varepsilon_\gamma + 1.41}{ln\left(\frac{0.58\ H}{0.8\ W + t}\right)}, \quad (6)$$

$$Z_0 = \frac{87}{\sqrt{\varepsilon_\gamma + 1.41}}\ ln\left(\frac{5.98\ H}{0.8\ W + t}\right) \quad (7)$$

$\varepsilon_\gamma$, H, t are dielectric constant of board material, board material height, and trace thickness, respectively.

VP81 is the pin diode driver, VC91 is the varactor diode driver, and Vb is the DC bias voltage. D81 and D82 are the pin diodes and D83 and D84 are the varactor diodes.

FIGS. 5-22 show the operation of a three stage filter 600 having the following component values: R1=R2=R3=R4=R5=R6=470 Ohms (Ω), R7=R8=51Ω, R10=R11=360Ω, R12=R13=R14=10KΩ, R15=R16=0Ω, L1=L2=L3=L4=0.67 nano Henrys (nH) to have a FR4 transmission line emulation range from 6 inch to 40 inch long, or L1=L2=L3=L4=3.3 nH to have a emulation range from 30 inch to 90 inch long. In FIG. 4A, D1=D2=D3=D4=D5=D6 and D11=D12=D13=D14=D15=D16. Note that all eye diagrams are shown with 10% pre-emphasis applied to the first transition.

Figure 5:
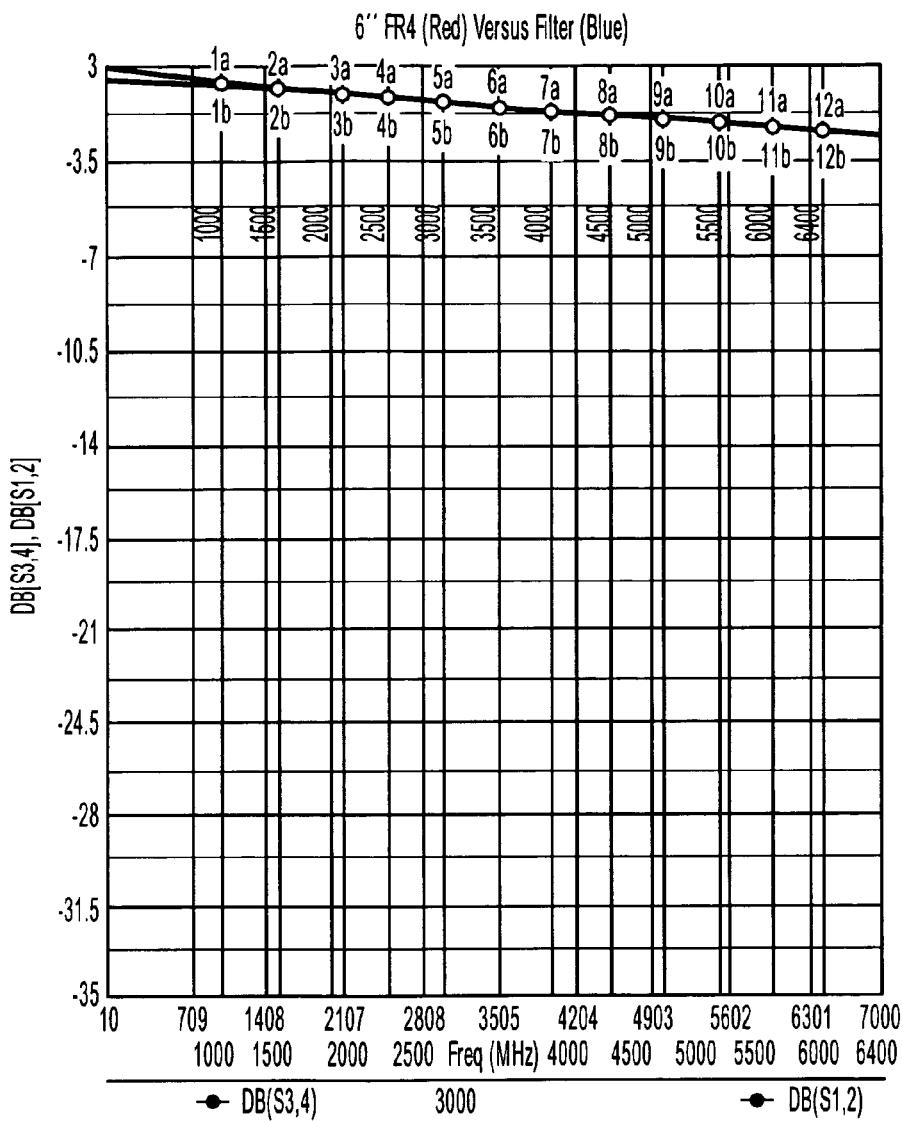
FIG. 5 is an illustration of a filter according to an embodiment of the present invention tracking the attenuation of a signal over a 6 inch FR4 transmission line over a frequency range of 1000 to 6400 MHz.
Figure 6:
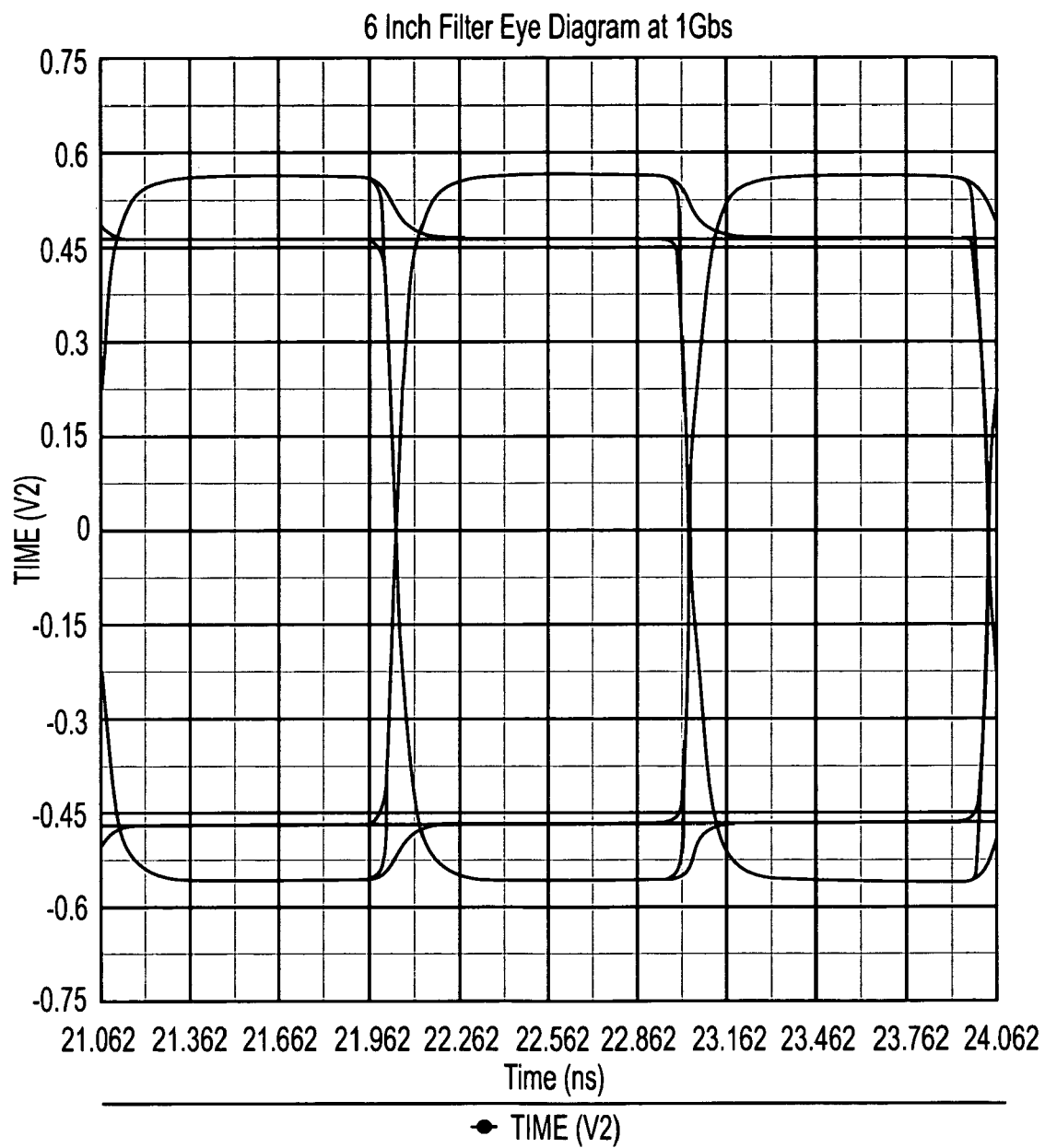
FIG. 6 is an illustration of the 6 inch filter eye diagram at 1 Gbps.
Figure 7:
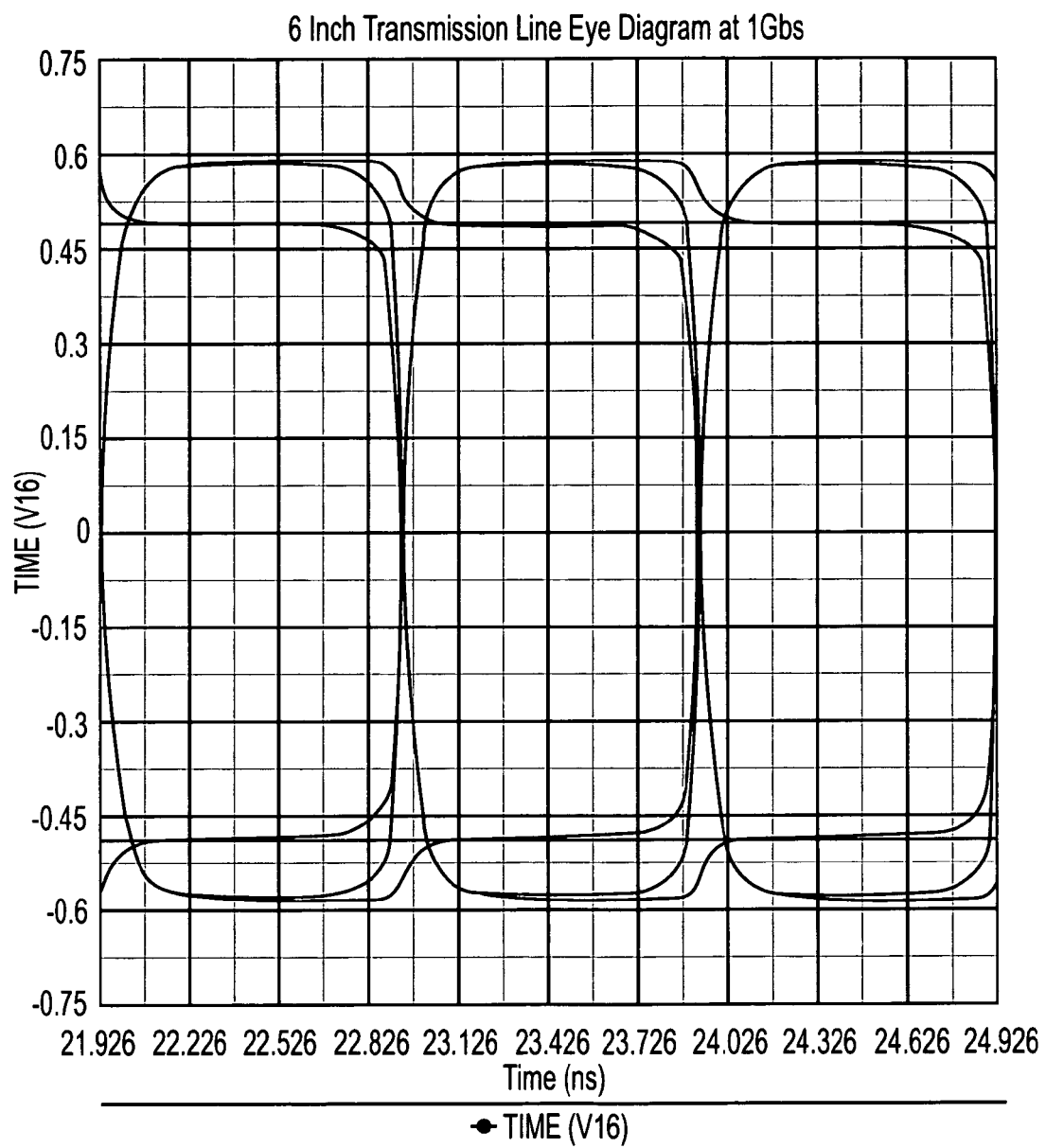
FIG. 7 is an illustration of a 6 inch transmission line eye diagram at 1 Gbps.
Figure 8:
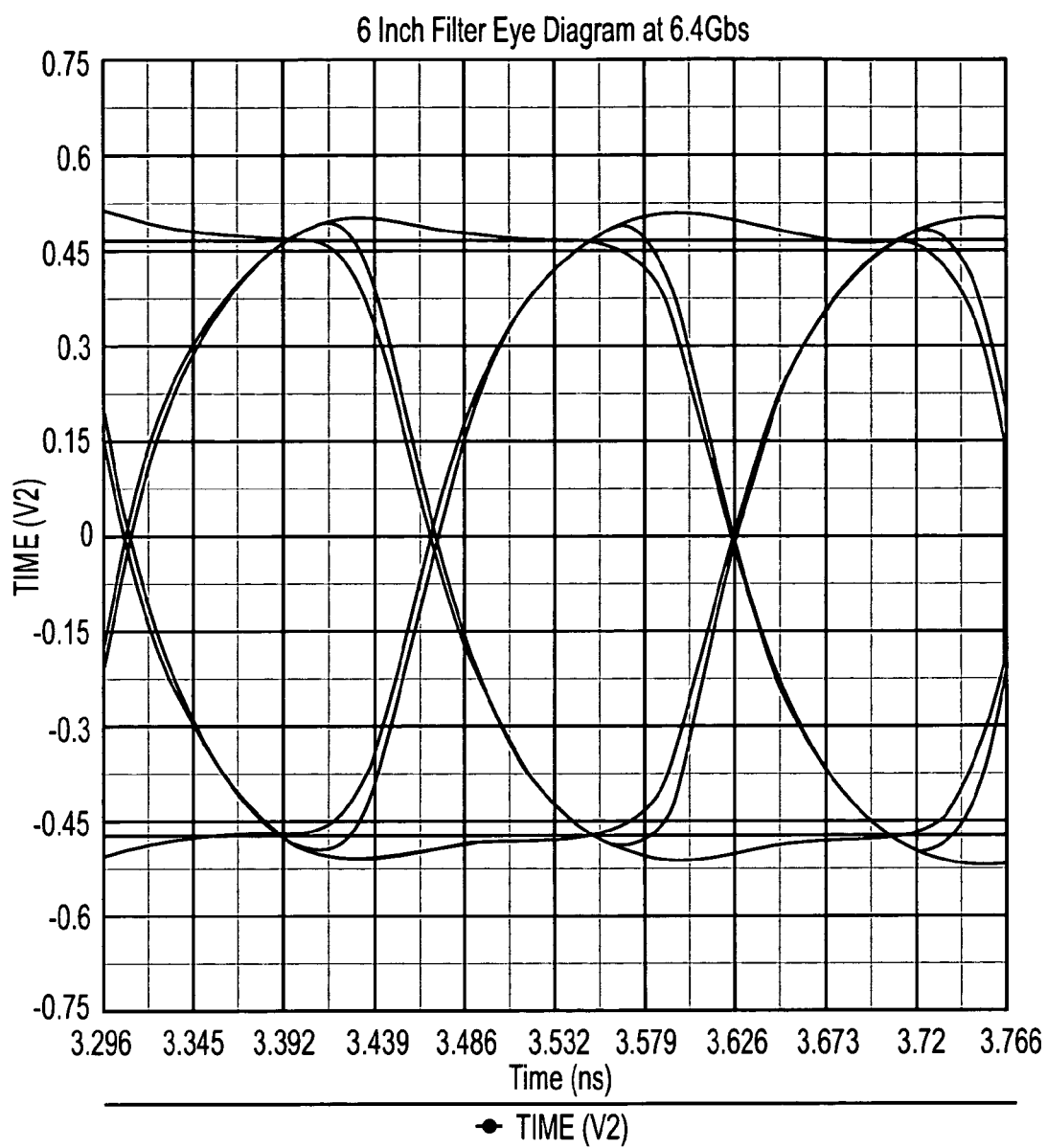
FIG. 8 is an illustration of a 6 inch filter eye diagram at 6.4 Gbps.
Figure 9:
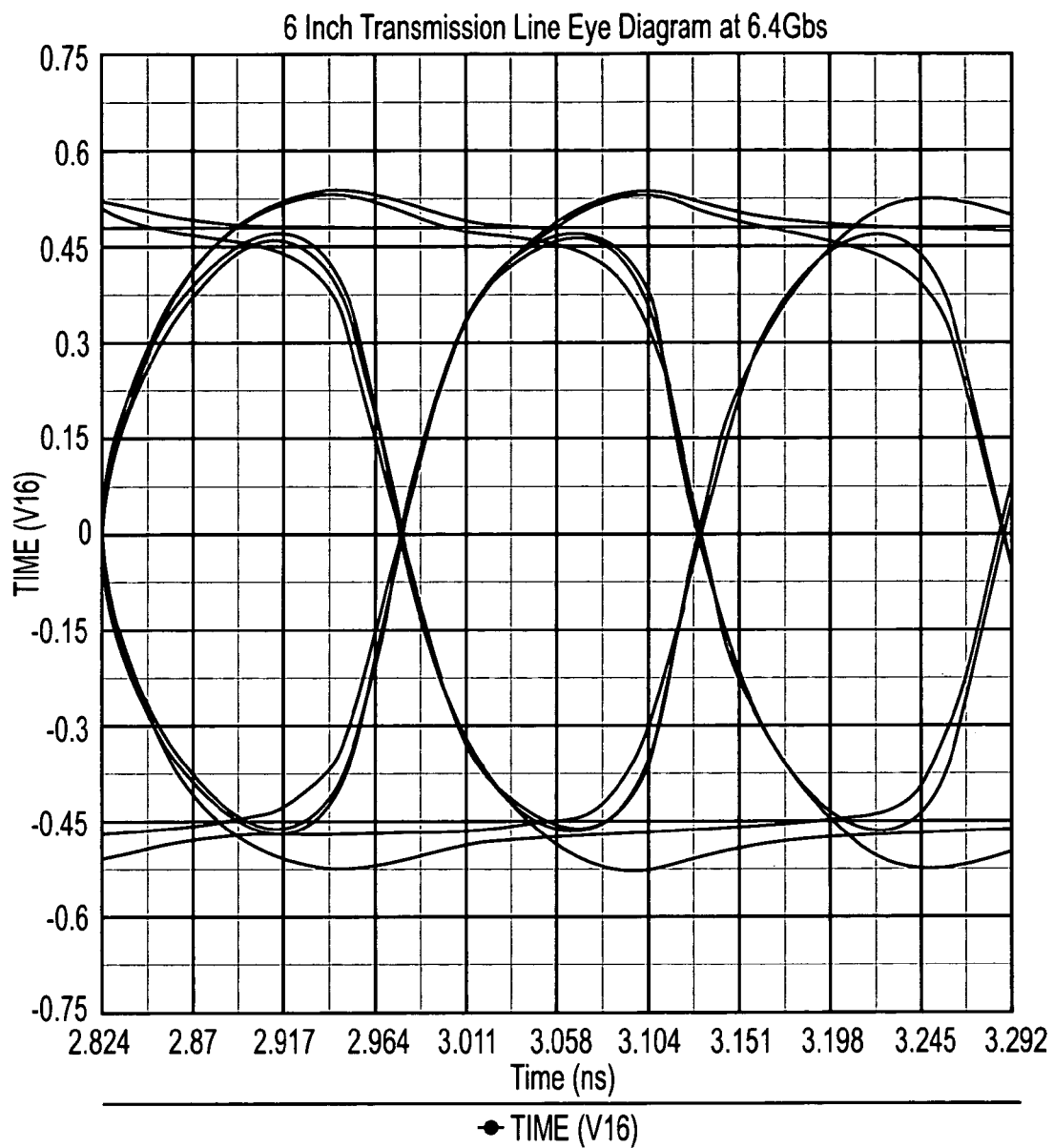
FIG. 9 is an illustration of a 6 inch transmission line eye diagram at 6.4 Gbps.

FIG. 5 illustrates how closely the filter 600 (L1=L2=L3=L4=0.67 nH) tracks the attenuation of a 6 inch FR4 transmission line over a frequency range of 1000 to 6400 MHz. FIG. 6 shows an illustration of the 6 inch filter eye diagram and FIG. 7 shows an illustration of a 6 inch transmission line eye diagram at 1 Gbps. FIG. 8 shows an illustration of a 6 inch filter eye diagram and FIG. 9 shows an illustration of a 6 inch transmission line eye diagram at 6.4 Gbps. FIGS. 6 and 7 illustrate the similarity between the eye closures of 6 inch filter and a 6 inch transmission line eye diagram at 1 Gbps, while FIGS. 8 and 9 illustrate the similarity between the eye closures of 6 inch filter and a 6 inch transmission line eye diagram at 6.4 Gbps.

Figure 10:
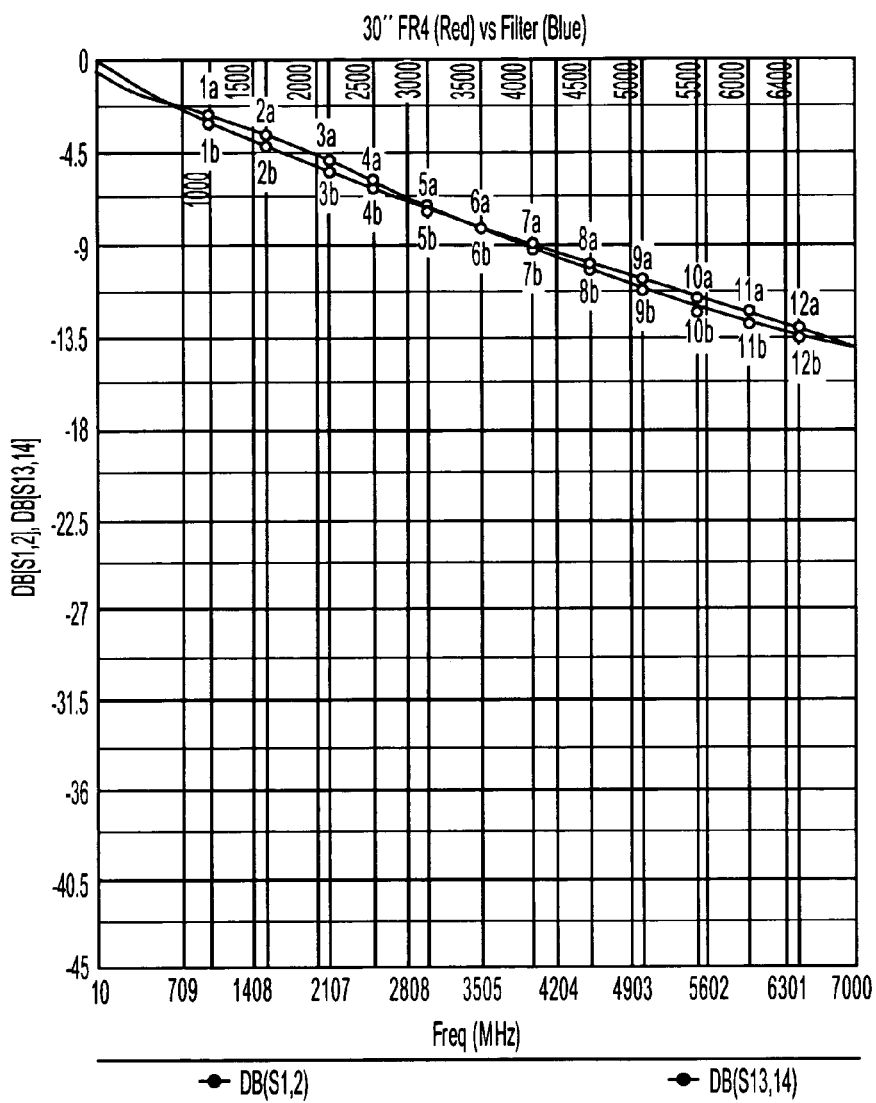
FIG. 10 is an illustration of a filter according to an embodiment of the present invention tracking the attenuation of a signal over a 30 inch FR4 transmission line over a frequency range of 1000 to 6400 MHz.
Figure 11:
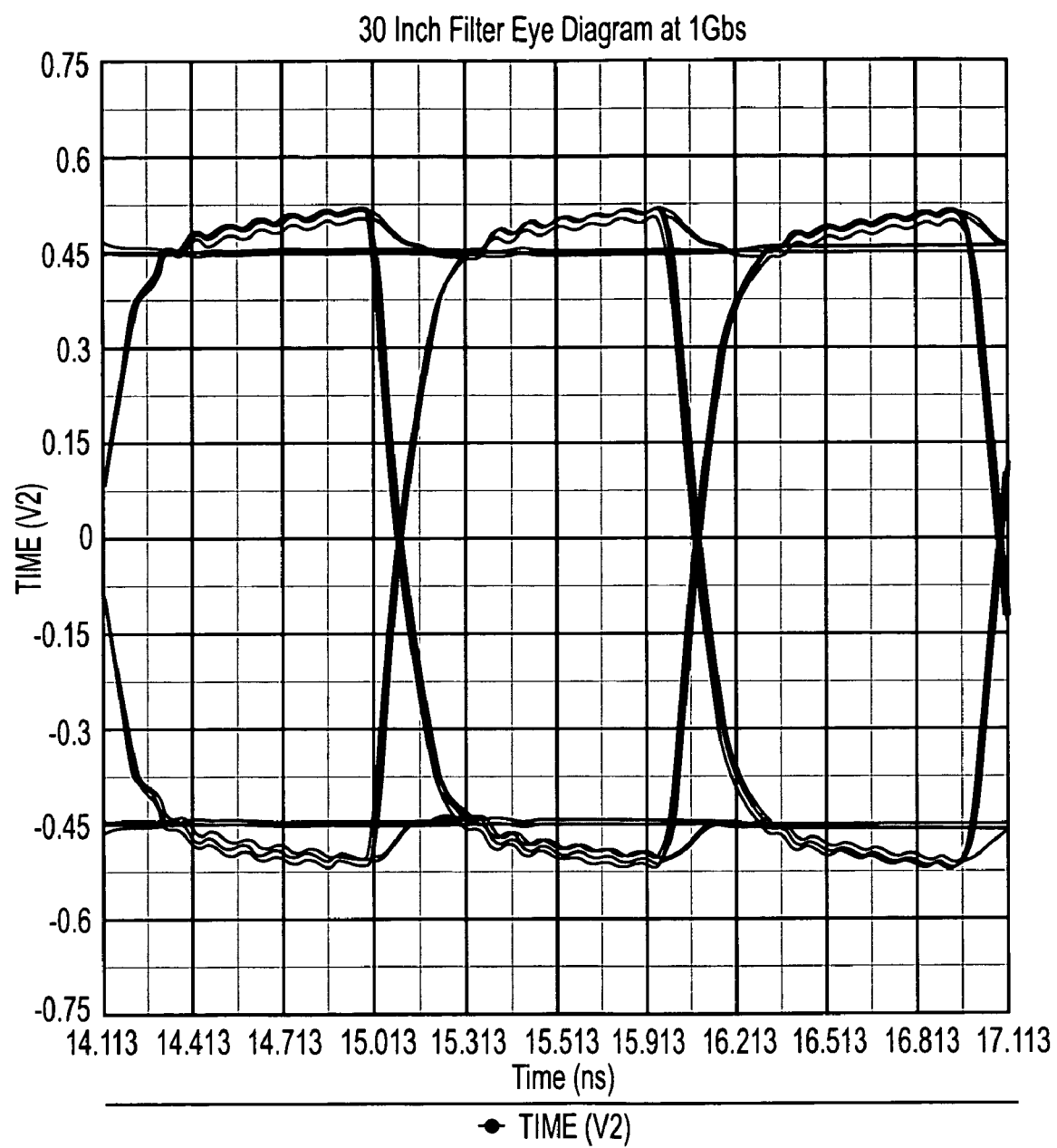
FIG. 11 is an illustration of the 30 inch filter eye diagram at 1 Gbps.
Figure 12:
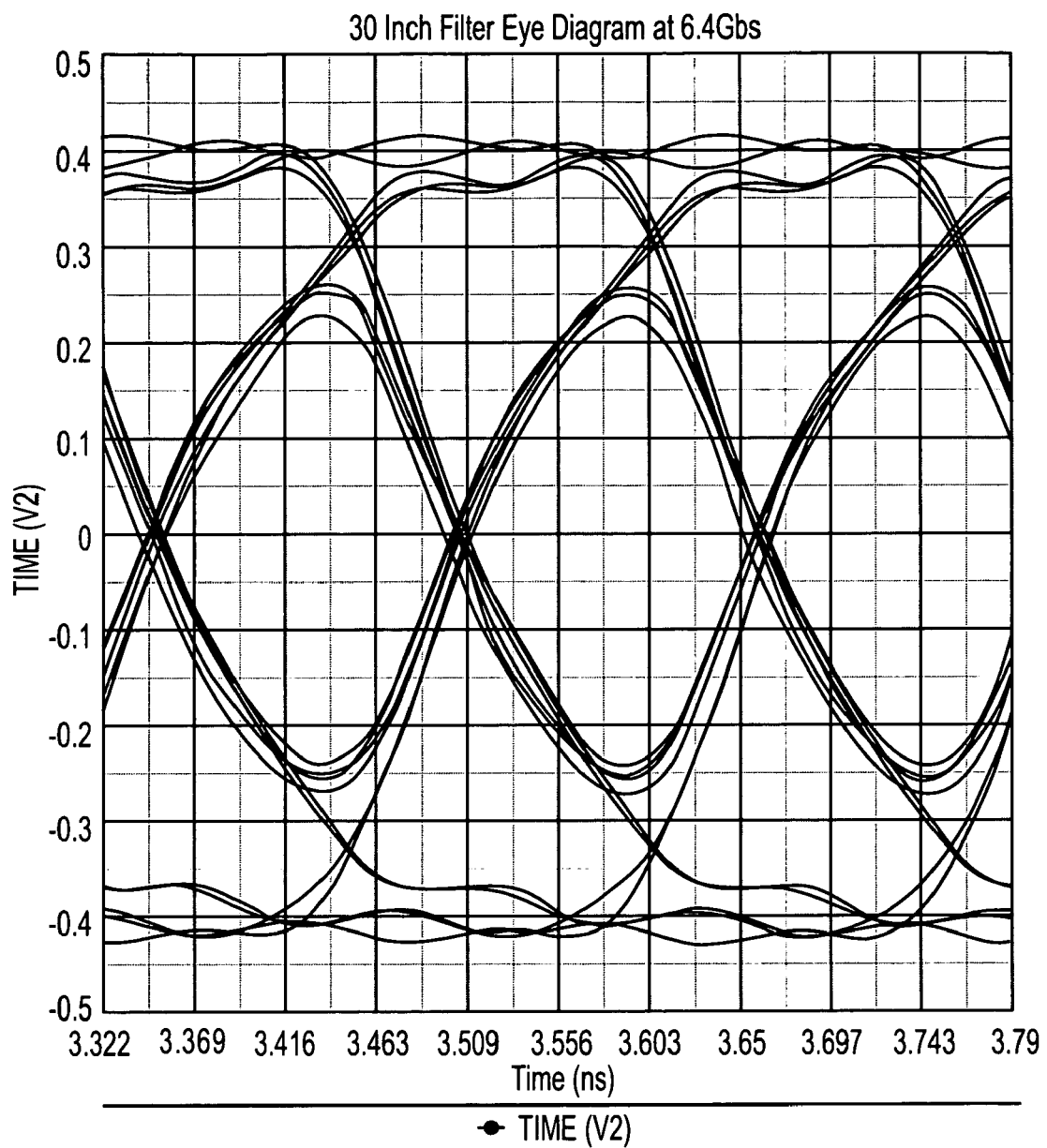
FIG. 12 is an illustration of a 30 inch filter eye diagram at 6.4 Gbps.
Figure 13:
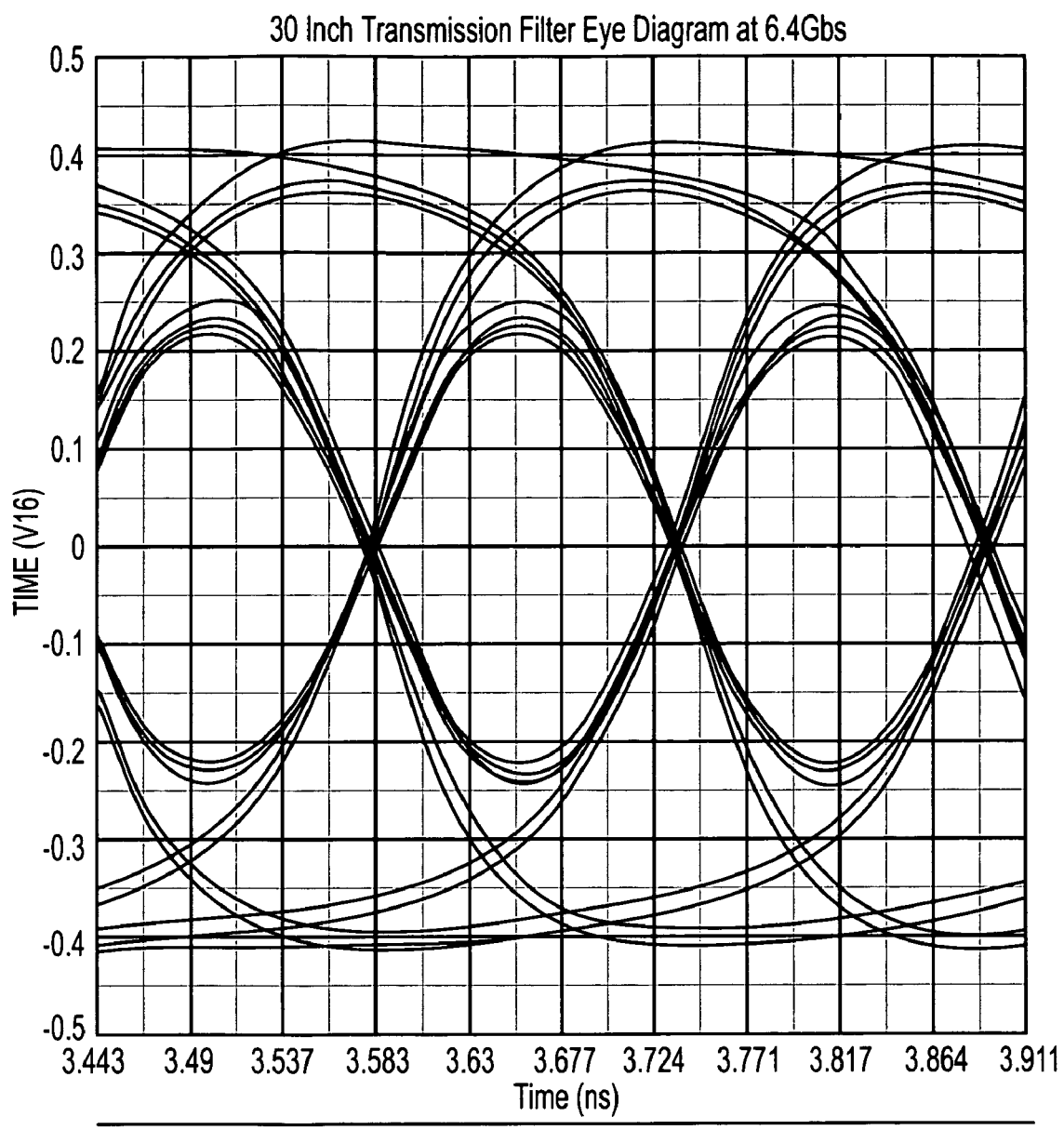
FIG. 13 is an illustration of a 30 inch transmission line eye diagram at 6.4 Gbps.

FIG. 10 illustrates how closely the filter 600 (L1=L2=L3=L4=3.3 nH) tracks the attenuation of a 30 inch FR4 transmission line over a frequency range of 1000 to 6400 MHz. FIG. 11 shows illustrations of a 30 inch filter at 1 Gbps. FIGS. 12 and 13 show illustrations of a 30 inch filter and transmission line eye diagrams respectively at 6.4 Gbps. FIGS. 12 and 13 illustrate the similarity between the eye closures of 30 inch filter and a 30 inch transmission line eye diagram at 6.4 Gbps.

Figure 14:
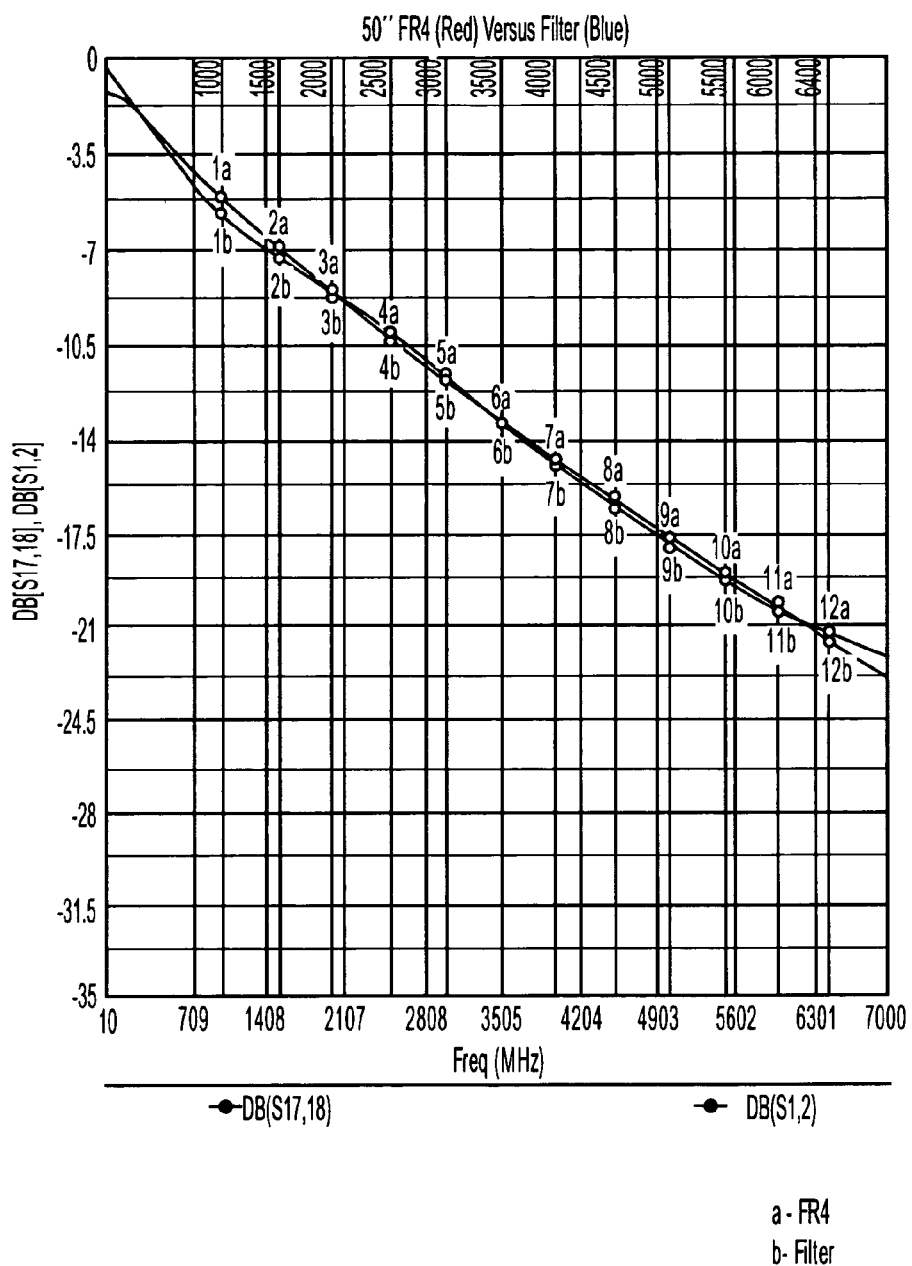
FIG. 14 is an illustration of a filter according to an embodiment of the present invention tracking the attenuation of a signal over a 50 inch FR4 transmission line over a frequency range of 1000 to 6400 MHz.
Figure 15:
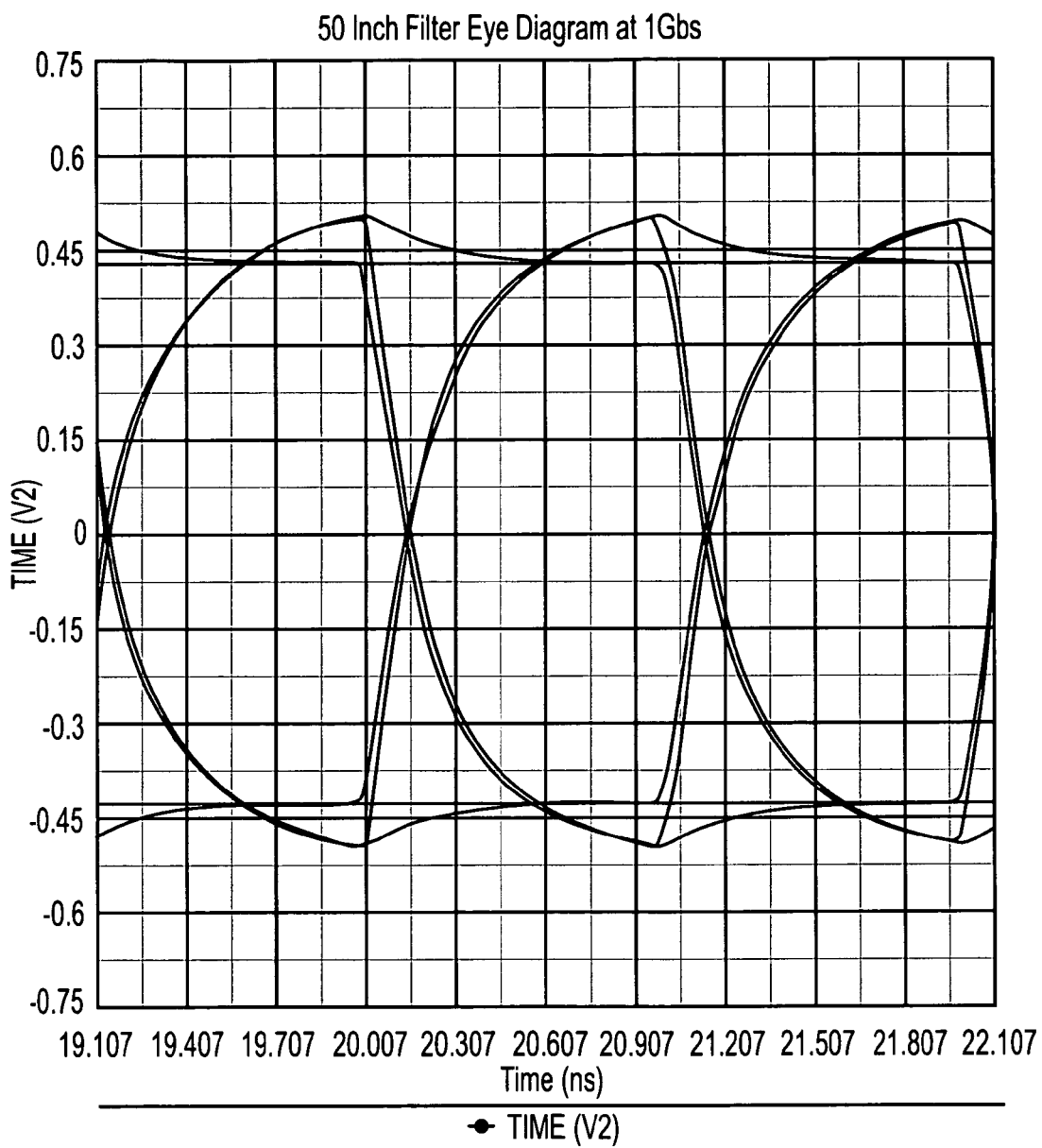
FIG. 15 is an illustration of the 50 inch filter eye diagram at 1 Gbps.
Figure 16:
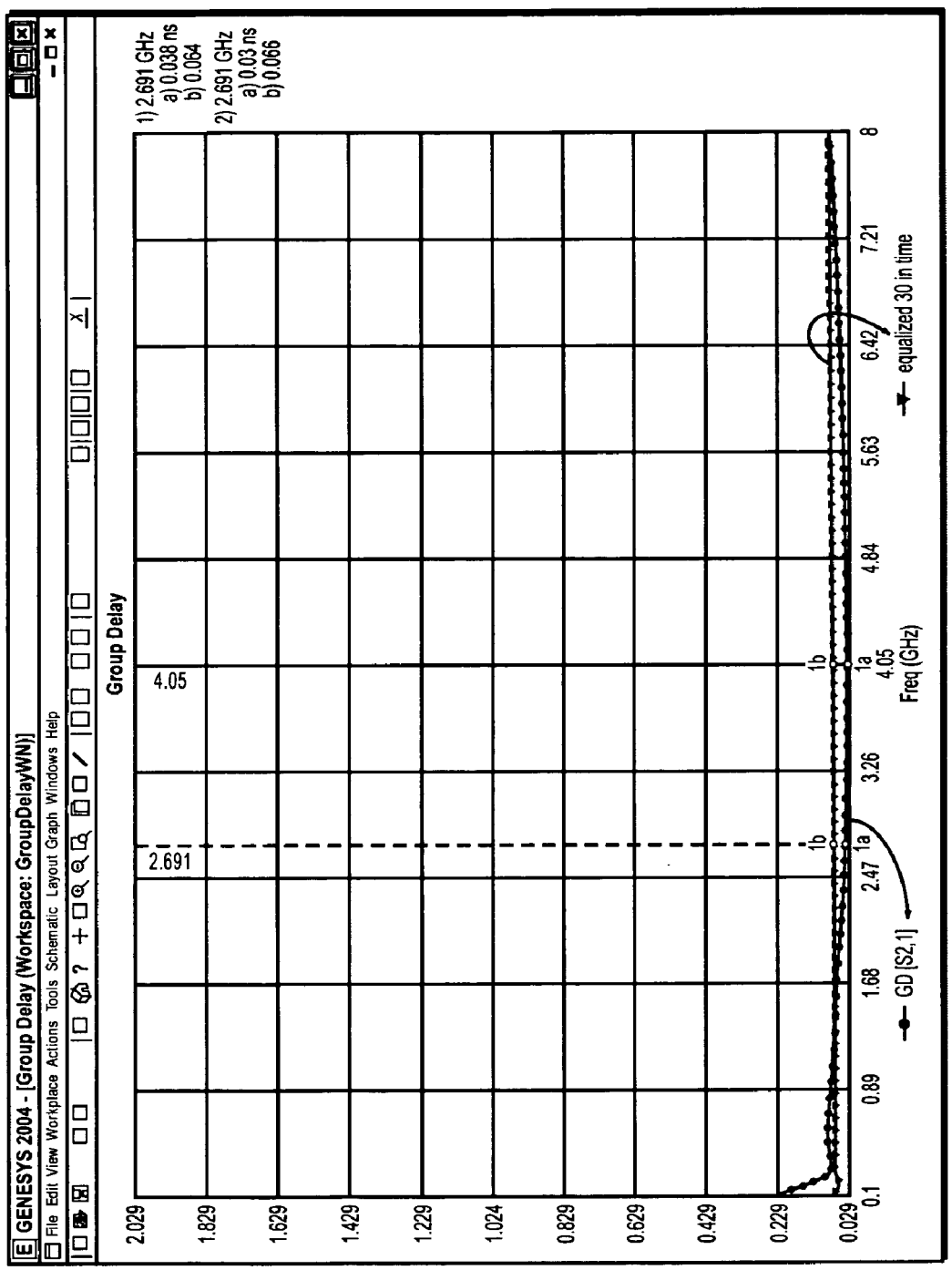
FIG. 16 is an illustration of the group delay of a 30 inch FR4 transmission line vs. a filter optimized to provide the same attenuation characteristic.
Figure 17:
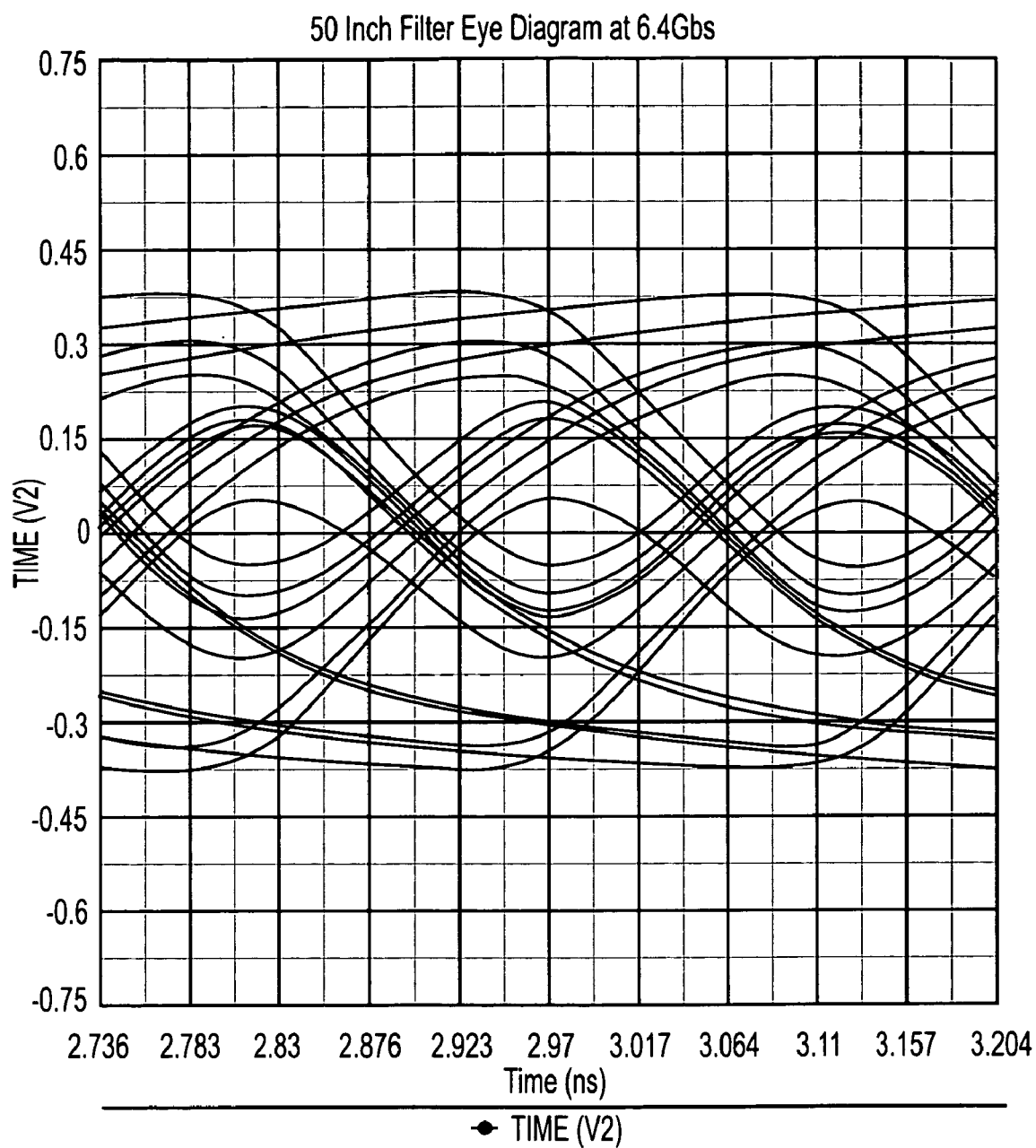
FIG. 17 is an illustration of a 50 inch filter eye diagram at 6.4 Gbps.
Figure 18:
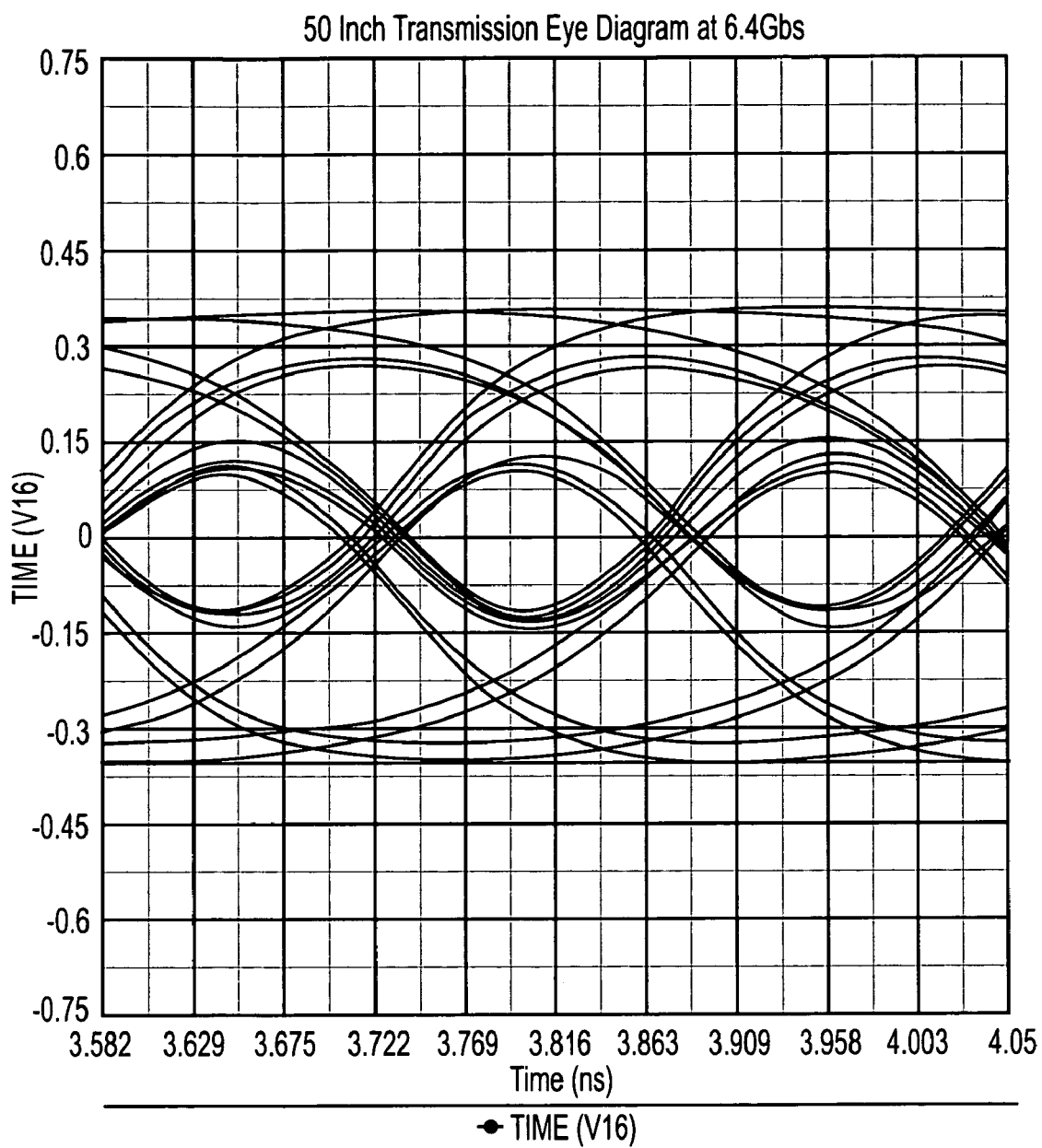
FIG. 18 is an illustration of a 50 inch transmission line eye diagram at 6.4 Gbps.

FIG. 14 illustrates how closely the filter 600 (L1=L2=L3=L4=0.67 nH) tracks the attenuation of a 50 inch FR4 transmission line over a frequency range of 1000 to 6400 MHz. FIGS. 15 and 16 show illustrations of 50 inch filter and 50 inch transmission eye diagrams respectively at 1 Gbps. FIGS. 17 and 18 show illustrations of 50 inch filter and 50 inch transmission eye diagrams respectively at 6.4 Gbps. FIGS. 15 and 16 illustrate the similarity between the eye closures of 50 inch filter and a 50 inch transmission line eye diagram at 1 Gbps, while FIGS. 17 and 18 illustrate the similarity between the eye closures of 50 inch filter and a 50 inch transmission line eye diagram at 6.4 Gbps.

Figure 19:
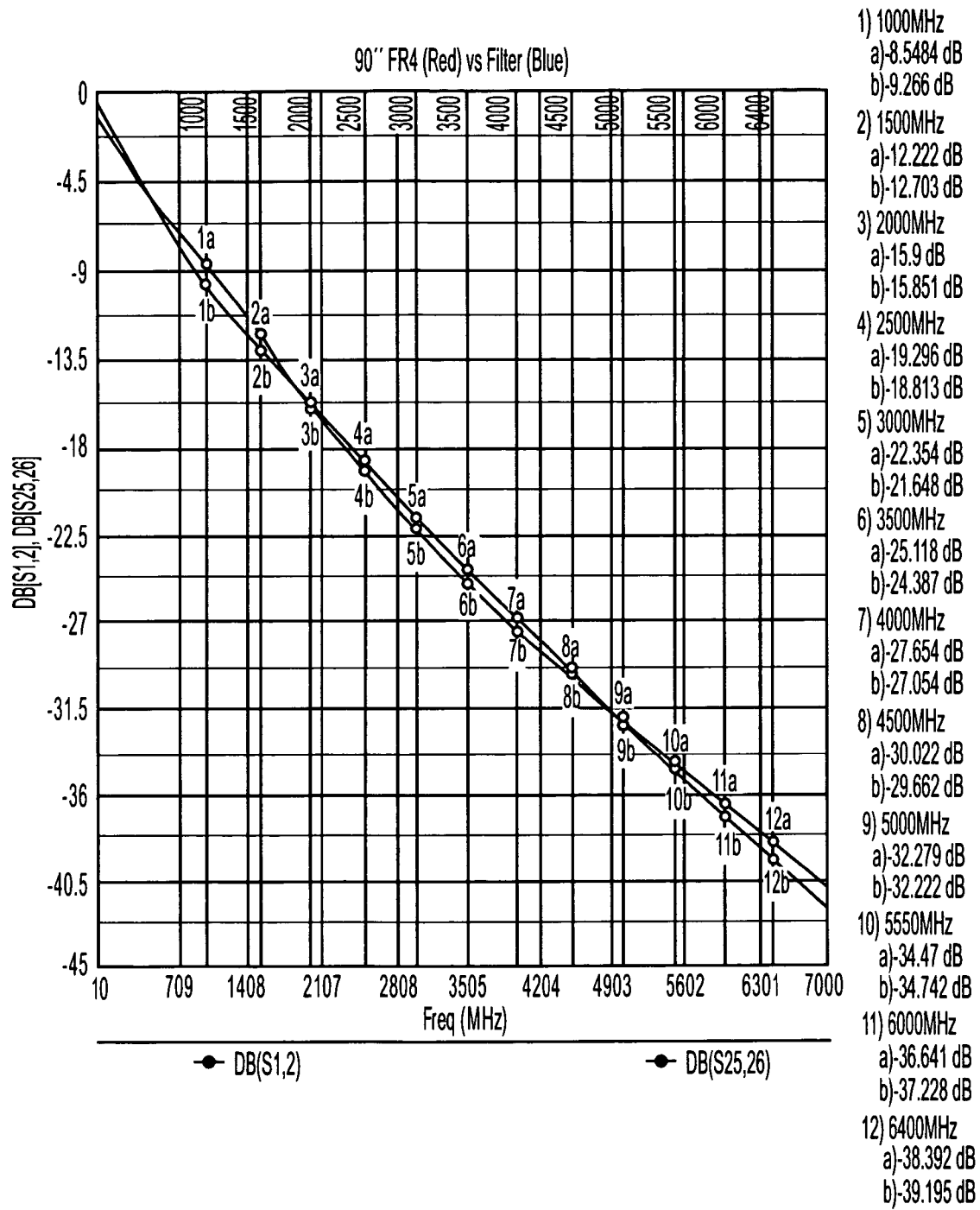
FIG. 19 is an illustration of a filter according to an embodiment of the present invention tracking the attenuation of a signal over a 90 inch FR4 transmission line over a frequency range of 1000 to 6400 MHz.
Figure 20:
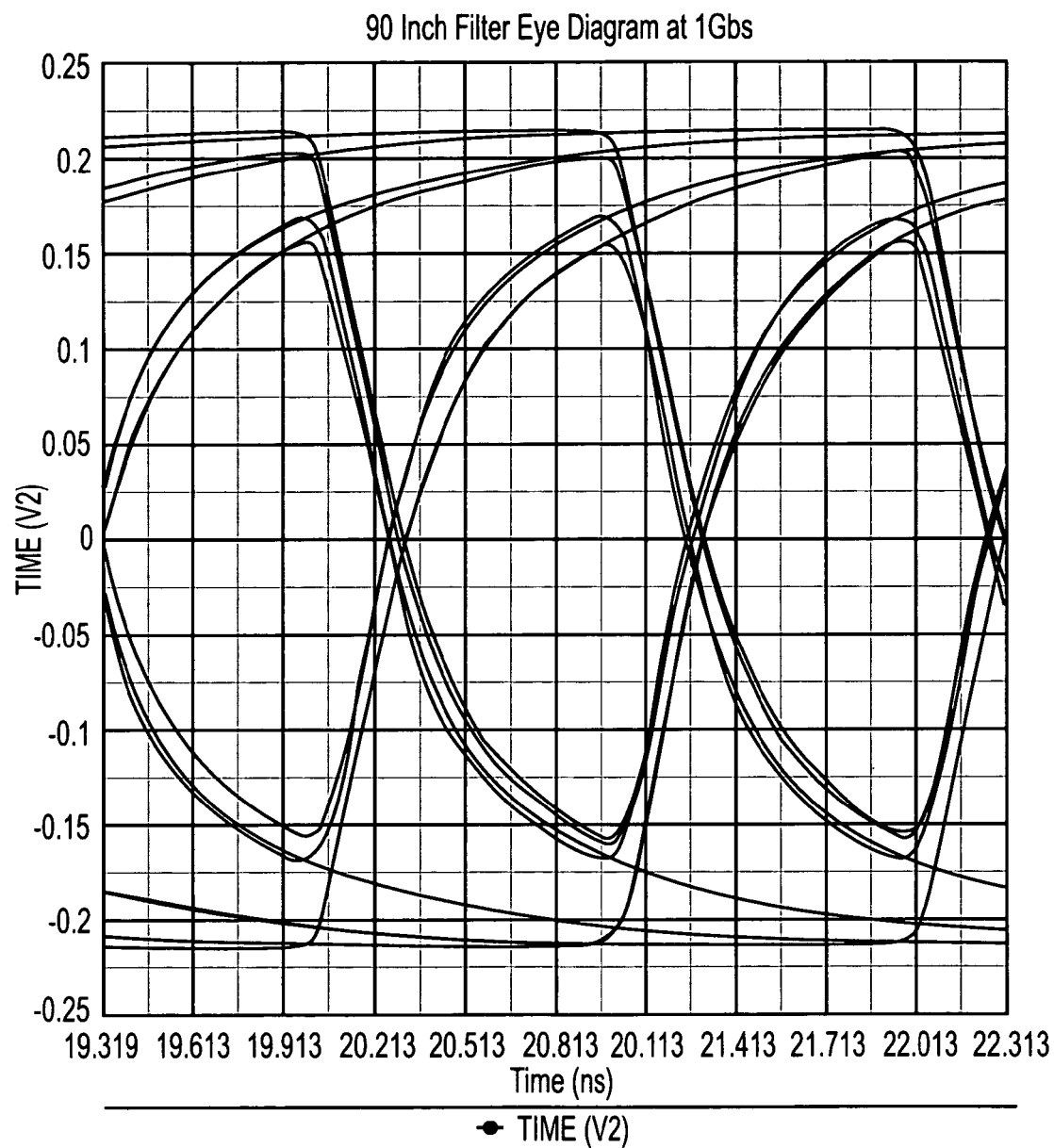
FIG. 20 is an illustration of the 90 inch filter eye diagram at 1 Gbps.
Figure 21:
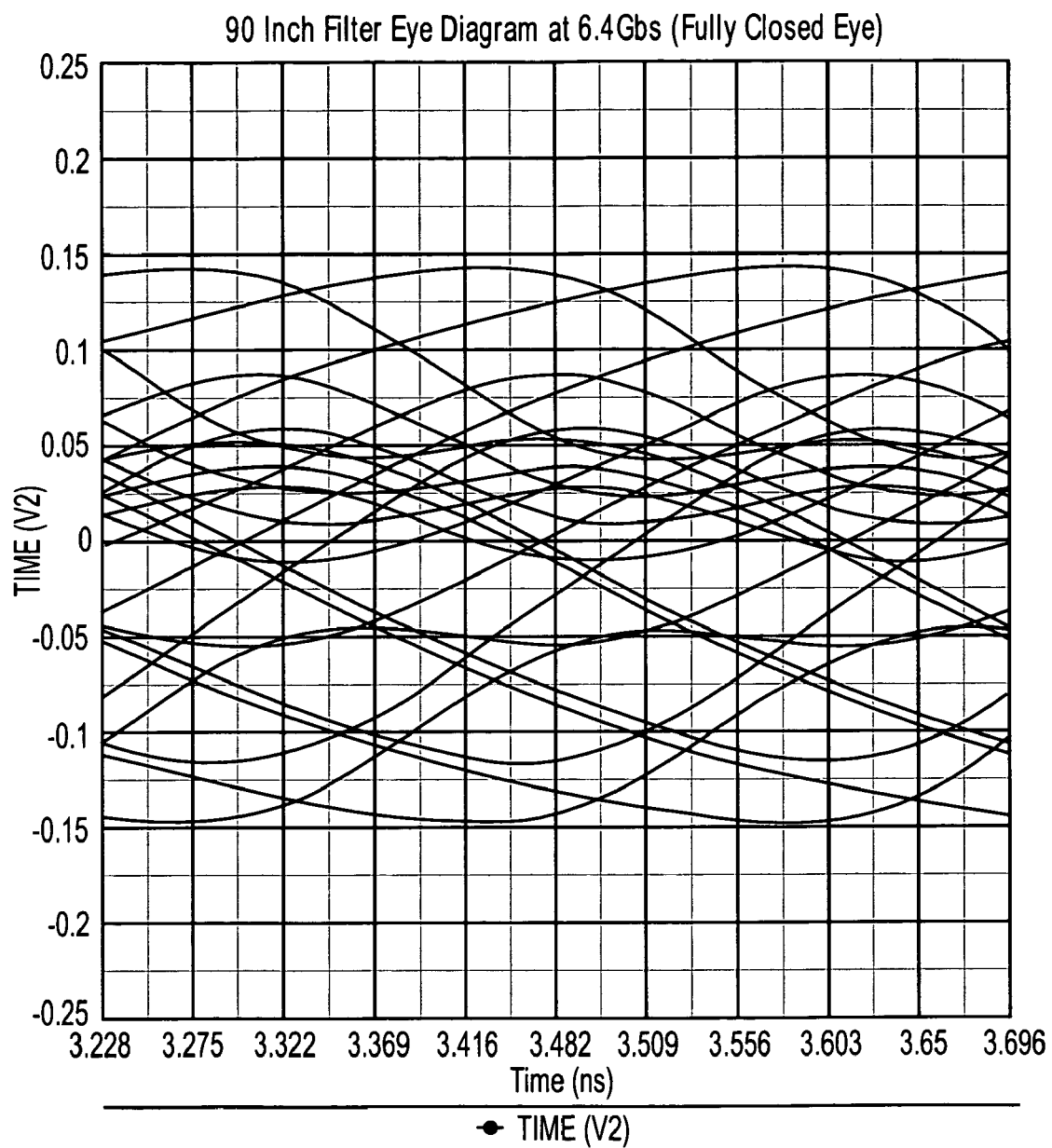
FIG. 21 is an illustration of a 90 inch filter eye diagram at 6.4 Gbps.
Figure 22:
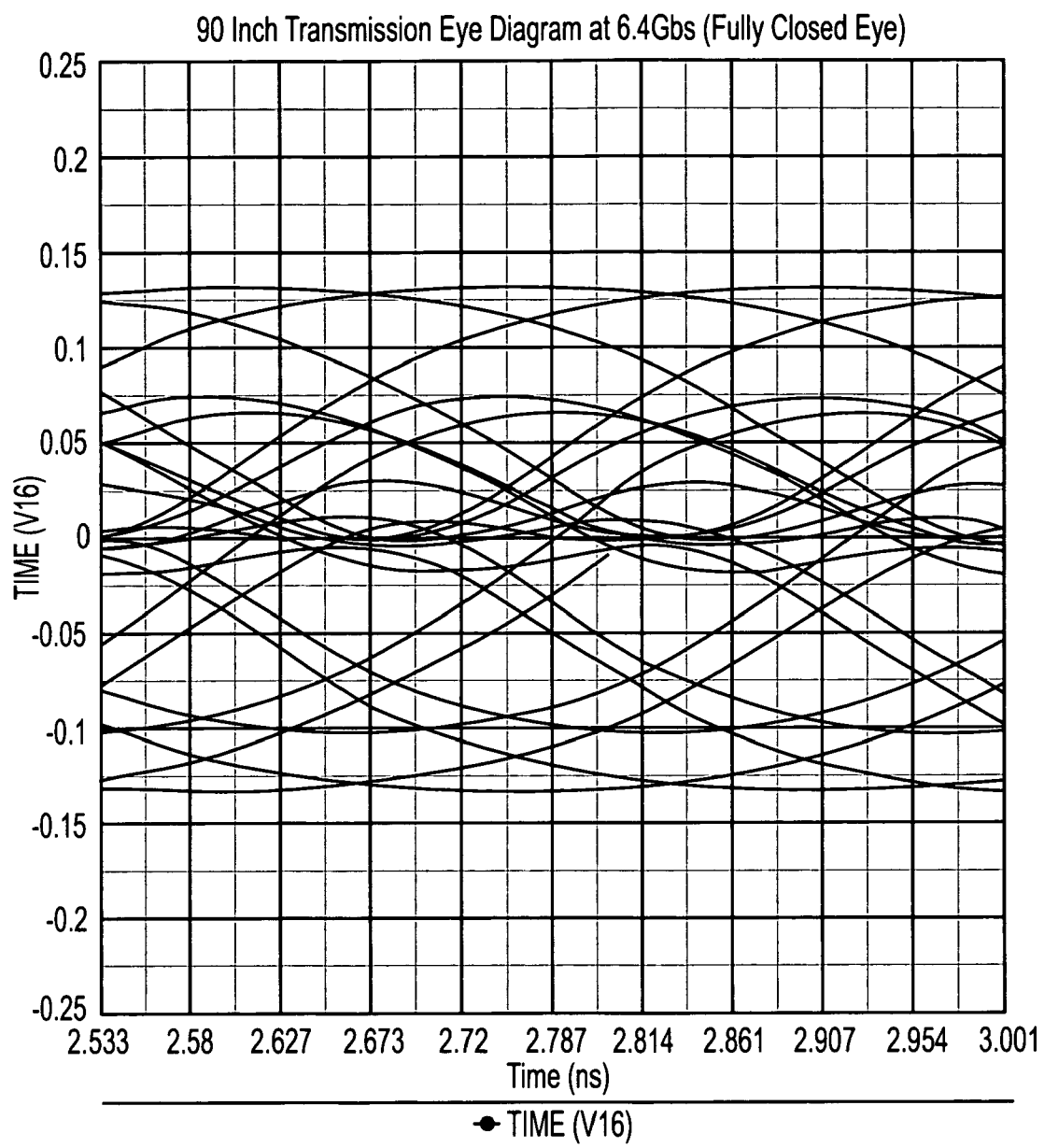
FIG. 22 is an illustration of a 90 inch transmission line eye diagram at 6.4 Gbps.

FIG. 19 shows an illustrates how closely the filter 600 (L1=L2=L3=L4=3.3 nH) tracks the attenuation of a 90 inch FR4 transmission line over a frequency range of 1000 to 6400 MHz. FIG. 20 illustrates the eye closure of 90 inch filter at 1 Gbps, while FIGS. 21 and 22 illustrate the similarity between the eye closures of 90 inch filter and a 90 inch transmission line eye diagram at 6.4 Gbps.

Figure 23:
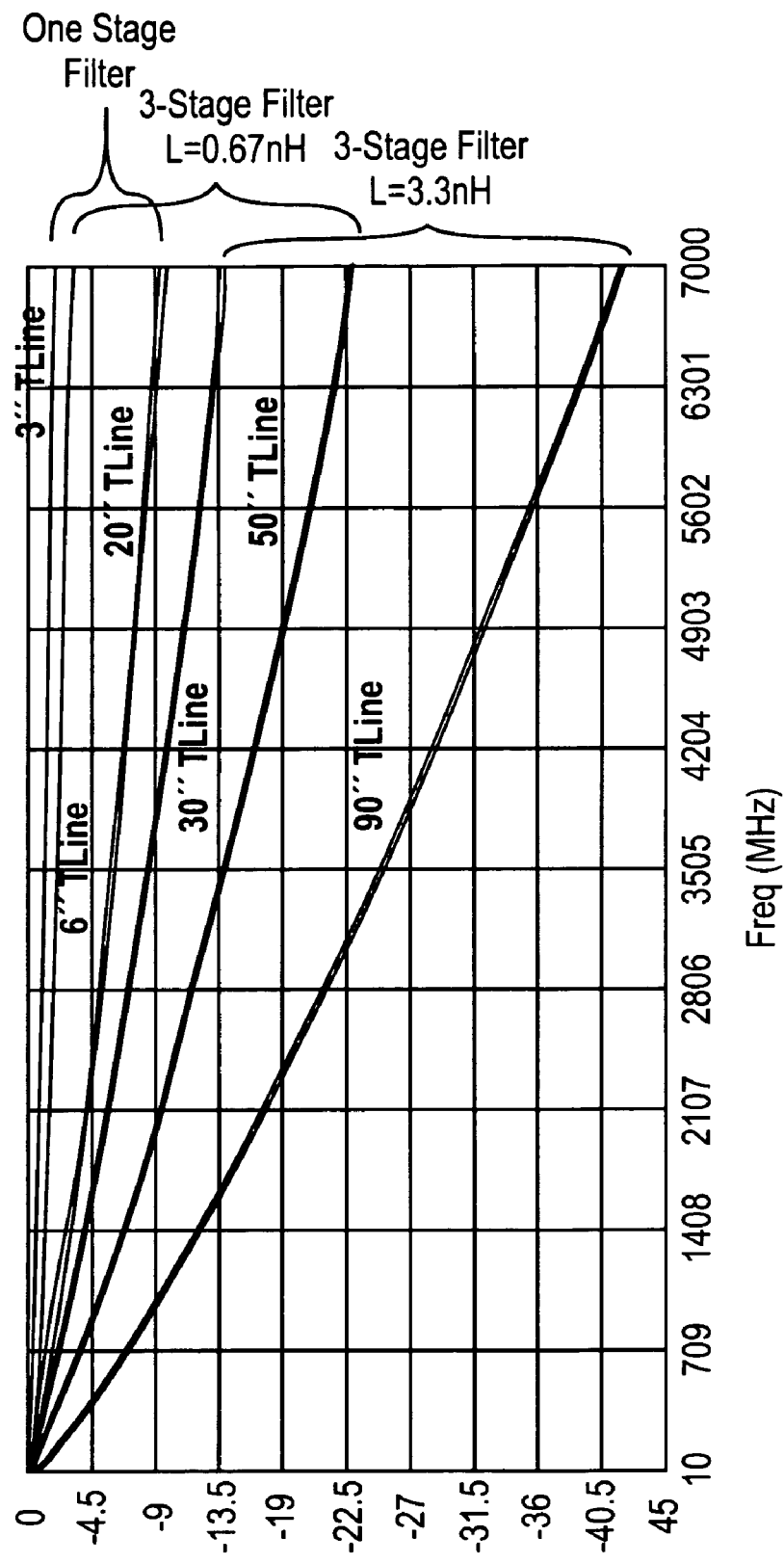
FIG. 23 is an illustration of transmission line emulation by an embodiment of a one stage filter, a three stage filter with inductance=0.67 nH, and a three stage filter with inductance=3.3 nH.

FIG. 23 illustrates transmission line emulation by a one stage filter, a three stage filter with inductance=0.67 nH, and a three stage filter with inductance=3.3 nH. The one stage filter emulates a 3 inch through 20 inch transmission line successfully, the three stage filter with inductance=0.67 nH emulates a 20 inch, a 30 inch and a 50 inch transmission line successfully, and the three stage filter with inductance=3.3 nH emulates a 30 inch, a 50 inch and a 90 inch transmission line successfully.

Figure 24:
FIGS. 24-26 illustrate an example of the operation of the three stage filter and the one stage filter using eye diagram representation according to one embodiment of the invention.
Figure 24:
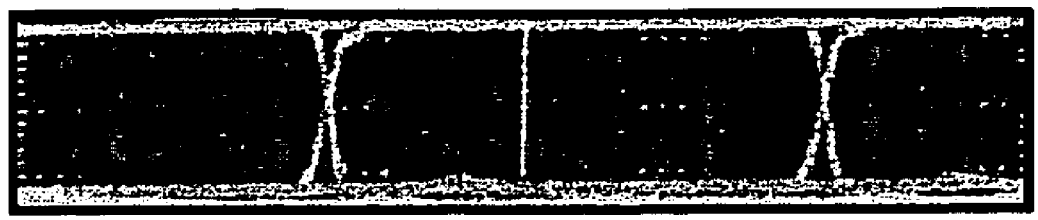
Figure 24:
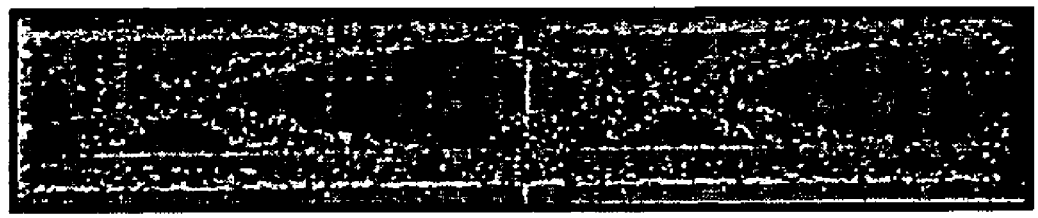
Figure 25:
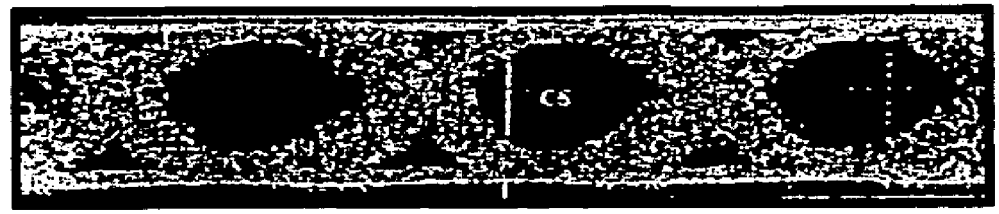
Figure 25:
Figure 25:
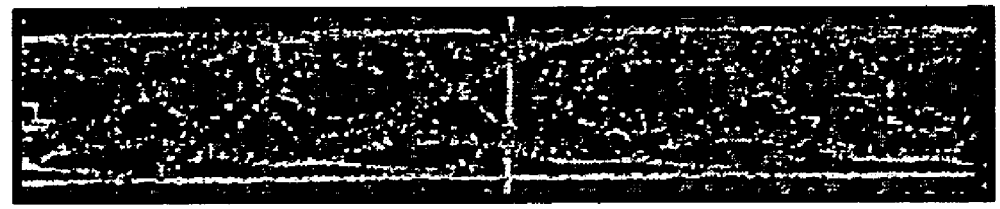
Figure 26:
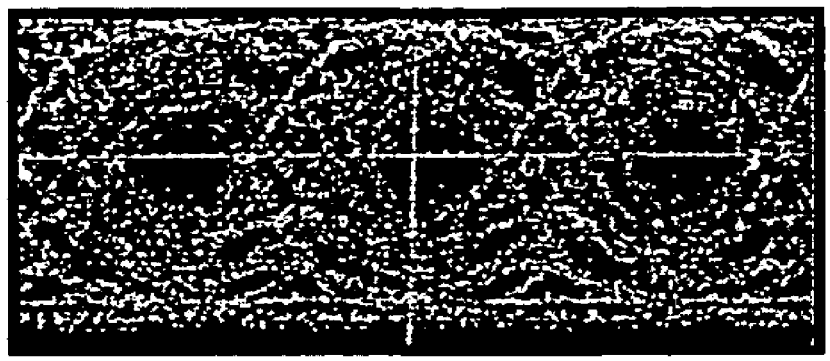
Figure 26:
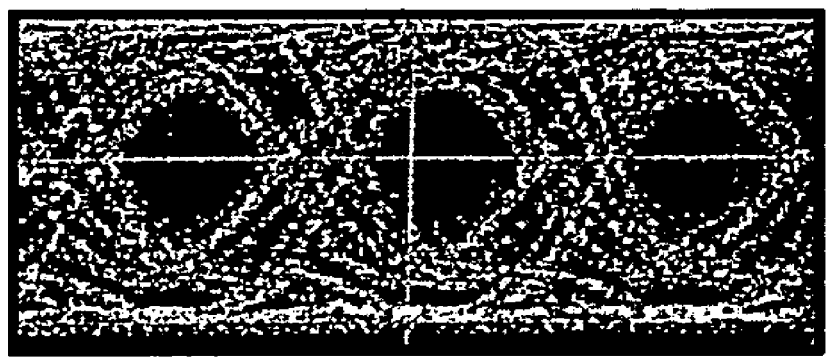
Figure 26:
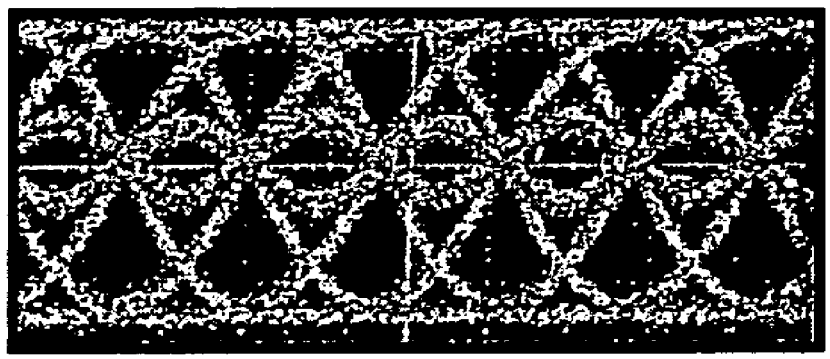

FIGS. 24-26 illustrate the operation of the three stage filter and the one stage filter using eye diagram representation. In this example, the three stage filter is driven by one output of a NBSG11 buffer and the single stage filter is driven by the other output of the buffer. The three stage filter employs 3.3 nH inductors to inject ISI at lower bit rates. The single stage filter uses 1.4 millimeter long thin lines to serve as 0.7 nH inductance for the filter. It is more difficult to achieve significant eye closure at low bit rates than at high ones.

In FIG. 24 waveforms (A) and (B) show that both filters, at I Gbps, work almost the same when they are tuned to have minimum ISI. This is because the PIN diodes, with zero DC current through them, have the highest resistance between the varactor capacitance and the signal paths, and at 1 Gbps parasitic capacitance and inductance are so small that there is no difference between the three stage and the single stage filters. Waveform (C) shows the maximum ISI injection by the three stage filter when it is tuned to have minimum PIN resistance and maximum varactor capacitance. For I Gbps, the maximum eye closure, 28% UI, is accomplished by this three stage filter.

In FIG. 25, waveforms (A) and (B) show both filters, at 6.4 Gbps, work differently even though they are tuned to have minimum ISI. This is because the inductance forms a filter with the 50 ohm termination impedance to provide a dominant pole at approximately $$F = \frac{R}{2\Pi L}.$$

Parasitics lower this pole further. Waveform (C) shows the maximum ISI injection by the single stage filter. In this case, the filter gives a maximum eye closure of 48%. At 6.4 Gbps, the three stage filter provides eye closure from 35% to 100%, while the single stage filter provides eye closure under 48%.

According to an embodiment of the invention, the filters are calibrated so as to closely match eye closure of real transmission lines. The problem solved by the calibration is illustrated in FIG. 26. FIG. 26 illustrates that waveforms (A) and (8) are more like transmission line eye diagrams than waveform (C) for the three stage filter at 6.4 Gbps. In this example, for waveform (A), the varactor diode voltages are: VC1=25V, VC2=10V, VC3=4V, the pin diode voltages are: VP1=0V, VP2=−1V, VP3=−1V. For waveform (B), the varactor diode voltages are: VC1=25V, VC2=20V, VC3=4V, the pin diode voltages are: VP1=0V, VP2=−1.7V, VP3=−1V. For waveform (C), the varactor diode voltages are: VC1=VC2=VC3=25V, the pin diode voltages are: VP1=VP2=VP3=0V.

One method for calibration is to use simulation. For example, modeling software may be used to obtain the optimized tuning parameters for emulating a certain length of transmission line. The PIN resistors are converted to PIN control voltages using the PIN diode R-I curve (e.g., as shown in FIG. 3A). In terms of percentage of the eye closure, a lookup table, for which tuning parameters VCI-VC3 and VPI-VP3 are indexed, can be built. Accordingly, the desired eye can be achieved by checking the lookup table.

Another method for calibration is to measure the filter's eye that matches very well with the transmission line eye, as waveforms (A) and (B) in FIG. 26. The same lookup table using VCI-VC3, VPI-VP3 as index can also be built. In this way, the tuning parameters can be set up to get the desired eye diagram based on the real measurement data of the filter. These tunable filters provide a method to achieve ISI for many applications.

Accordingly, two differential ISI injection filters are designed to work from 1 Gbps to 6.4 Gbps for SerDes device testing. By using PIN and varactor diodes, the filters can be made to match the characteristics of transmission lines over a larger range of lengths than the varactor only filter. The three stage filter may close an eye by almost 28% for 1 Gbps data stream and by up to 100% for 6.4 Gbps data stream. The single stage filter can be used as the baseline when it is tuned to have minimum ISI injection. It can also serve as a fine tune filter for higher bit rate ISI injection.

In the forgoing specification, the invention has been described with reference to specific exemplary embodiments. It will, however, be evident that various modifications and changes may be made thereto without departing from the broader spirit and scope of the invention. The specification and drawings are accordingly to be regarded in an illustrative sense rather than a restrictive sense.

What is claimed is:

1. An apparatus comprising:
   a low pass differential filter to inject Inter Symbol Interference ("ISI") into a digital data signal with a given data rate, wherein the low pass filter includes
   a first pin diode,
   a second pin diode,
   a first inductive element coupled to the first in diode,
   a second inductive element coupled to the second pin diode, and
   a pair of varactor diodes, wherein the varactor diodes are coupled between the first and second pin diodes and the first and second pin diodes are coupled between the first and second inductive elements.

2. The apparatus of claim 1, wherein the pin diode operates as a variable resistive element and the varactor diode operates as a variable capacitive element.

3. The apparatus of claim 1, wherein the filter is a differential filter that operates at a signal level of approximately 400 mV peak to peak differential.

4. The apparatus of claim 1, wherein the filter injects Inter Symbol Interference (ISI) into a digital data signal for testing of SerDes devices.

5. The apparatus of claim 1, wherein the filter emulates transmission line characteristics for transmission line length ranging from about 6 inches to 50 inches using a fixed inductor value of 0.67 nH and about 30 inches to 90 inches using a fixed inductor value of 3.3 nH.

6. The apparatus of claim 1, wherein the filter creates eye closure having a range of up to 50% UI at 1 Gbps and less than 50% UI at 6.4 Gbps.

7. The apparatus of claim 1, wherein filter bandwidth is increased by lowering the capacitance of the varactor diodes.

8. The apparatus of claim 1, wherein sharpness of signal roll-off characteristic is increased by lowering the resistance of the pin diodes.

9. The apparatus of claim 8, wherein the resistance of the pin diodes is lowered by increasing current through the pin diodes.

10. The apparatus of claim 9, further comprising a DC balance circuit to offset a shifting of the operating voltage across the filter caused by varying current through the pin diodes.

11. An apparatus, comprising:
    a multi-stage variable low pass filter to inject Inter Symbol Interference (ISI) into a digital data Signal with a given data rate, wherein the low pass filter includes
    a first pin diode,
    a second pin diode,
    a first inductive element coupled to the first in diode,
    a second inductive element coupled to the second pin diode, and
    a pair of varactor diodes, wherein the varactor diodes are coupled between the first and second pin diodes and the first and second pin diodes are coupled between the first and second inductive elements.

12. The apparatus of claim 11, wherein the pin diodes and varactor diodes are tuned to emulate a range of transmission line length by using different inductor values.

13. The apparatus of claim 12, wherein the pin diodes operate as variable resistive elements and the varactor diodes operate as variable capacitive elements.

14. The apparatus of claim 12, wherein filter bandwidth is increased by lowering the capacitance of the varactor diodes.

15. The apparatus of claim 12, wherein sharpness of signal roll-off characteristic is increased by lowering the resistance of the pin diodes.

16. The apparatus of claim 12, wherein the resistance of the pin diodes is lowered by increasing current through the pin diodes.

17. The apparatus of claim 12, further comprising a DC balance circuit to offset a shifting of the operating voltage across the filter caused by varying current through the pin diodes.

18. A method comprising:
    using a filter to inject data dependent jitter into a digital data signal with a given data rate, the a low pass differential filter comprising
    a first pin diode,
    a second pin diode,
    a first inductive element coupled to the first pin diode,
    a second inductive element coupled to the second pin diode, and
    a pair of varactor diodes, wherein the varactor diodes are coupled between the first and second pin diodes and the first and second pin diodes are coupled between the first and second inductive elements.

19. The method of claim 18, wherein the pin diodes and varactor diodes are tuned to emulate a range of transmission line length by using different inductor values.

* * * * *